(12) United States Patent
Sakai et al.

(10) Patent No.: US 8,461,062 B2
(45) Date of Patent: Jun. 11, 2013

(54) SUBSTRATE PROCESSING APPARATUS AND METHOD FOR MANUFACTURING SEMICONDUCTOR DEVICE

(75) Inventors: Masanori Sakai, Takaoka (JP); Yuji Takebayashi, Toyama (JP); Tsutomu Kato, Takaoka (JP); Shinya Sasaki, Toyama (JP); Hirohisa Yamazaki, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 13/331,258

(22) Filed: Dec. 20, 2011

(65) Prior Publication Data

US 2012/0122318 A1    May 17, 2012

Related U.S. Application Data

(62) Division of application No. 12/320,577, filed on Jan. 29, 2009, now abandoned.

(30) Foreign Application Priority Data

Jan. 31, 2008 (JP) .................................. 2008020761
Nov. 12, 2008 (JP) .................................. 2008290104
Dec. 8, 2008 (JP) .................................. 2008312661

(51) Int. Cl.
| | | |
|---|---|---|
| *C23C 16/455* | (2006.01) | |
| *C23C 16/458* | (2006.01) | |
| *C23C 16/52* | (2006.01) | |
| *C23F 1/00* | (2006.01) | |
| *H01L 21/306* | (2006.01) | |
| *C23C 16/06* | (2006.01) | |
| *C23C 16/22* | (2006.01) | |

(52) U.S. Cl.
USPC .................. 438/935; 427/248.1; 427/255.23; 118/696; 118/704; 156/345.33; 156/345.24; 156/345.26

(58) Field of Classification Search
USPC ........... 438/935; 427/248.1, 255.23; 118/696, 118/704; 156/345.33, 345.24, 345.26
See application file for complete search history.

(56) References Cited

U.S. PATENT DOCUMENTS 4,098,923 A * 7/1978 Alberti et al. ................. 438/784
4,369,031 A * 1/1983 Goldman et al. ............. 432/198

(Continued)

FOREIGN PATENT DOCUMENTS

JP 63081920 A * 4/1988
JP 63100183 A * 5/1988

(Continued)

OTHER PUBLICATIONS

Nov. 29, 2011 Office Action issued in JP Application No. 2009-061423 (with English translation).

(Continued)

*Primary Examiner* — Rudy Zervigon
(74) *Attorney, Agent, or Firm* — Oliff & Berridge, PLC

(57) ABSTRACT

The substrate processing apparatus includes: a processing chamber for storing and processing substrates stacked in multiple stages in horizontal posture; at least one processing gas supply nozzle which extends running along an inner wall of the processing chamber in the stacking direction of the substrates and supplies a processing gas to the inside of the processing chamber; a pair of inactive gas supply nozzles which are provided so as to extend running along the inner wall of the processing chamber in the stacking direction of the substrates and so as to sandwich the processing gas supply nozzle from both sides thereof along the circumferential direction of the substrates and which supply the inactive gas to the inside of the processing chamber; and an exhaust line for exhausting the inside of the processing chamber.

8 Claims, 7 Drawing Sheets

U.S. PATENT DOCUMENTS

| | | | | |
|---|---|---|---|---|
| 4,557,950 A | * | 12/1985 | Foster et al. | 438/774 |
| 4,573,431 A | * | 3/1986 | Sarkozy | 118/725 |
| 4,699,805 A | * | 10/1987 | Seelbach et al. | 438/680 |
| 4,854,266 A | * | 8/1989 | Simson et al. | 118/728 |
| 5,217,560 A | * | 6/1993 | Kurono et al. | 156/345.43 |
| 5,383,984 A | * | 1/1995 | Shimada et al. | 156/345.26 |
| 5,540,781 A | * | 7/1996 | Yamagami et al. | 118/723 E |
| 5,616,264 A | * | 4/1997 | Nishi et al. | 219/494 |
| 5,618,349 A | * | 4/1997 | Yuuki | 118/715 |
| 5,622,566 A | * | 4/1997 | Hosaka et al. | 118/723 VE |
| 5,804,507 A | * | 9/1998 | Perlov et al. | 438/692 |
| 5,900,177 A | * | 5/1999 | Lecouras et al. | 219/497 |
| 5,916,365 A | * | 6/1999 | Sherman | 117/92 |
| 5,925,188 A | * | 7/1999 | Oh | 118/715 |
| 5,968,593 A | * | 10/1999 | Sakamoto et al. | 427/248.1 |
| 6,139,642 A | * | 10/2000 | Shimahara et al. | 118/724 |
| 6,204,194 B1 | * | 3/2001 | Takagi | 438/758 |
| 6,299,683 B1 | | 10/2001 | Rupp et al. | |
| 6,413,884 B1 | * | 7/2002 | Moriyama | 438/784 |
| 6,524,650 B1 | * | 2/2003 | Shimahara et al. | 427/248.1 |
| 6,585,823 B1 | * | 7/2003 | Van Wijck | 117/89 |
| 6,599,845 B2 | * | 7/2003 | Sato et al. | 438/770 |
| 6,613,692 B1 | * | 9/2003 | Toshima et al. | 438/745 |
| 6,656,282 B2 | * | 12/2003 | Kim et al. | 118/695 |
| 6,730,885 B2 | * | 5/2004 | Suzuki et al. | 219/486 |
| 6,790,793 B2 | * | 9/2004 | Nishino et al. | 438/770 |
| 6,803,548 B2 | * | 10/2004 | Wang et al. | 219/494 |
| 6,814,572 B2 | * | 11/2004 | Okabe | 432/200 |
| 6,867,147 B2 | * | 3/2005 | Takagi | 438/714 |
| 6,869,892 B1 | * | 3/2005 | Suzuki et al. | 438/770 |
| 7,022,184 B2 | * | 4/2006 | Van Wijck | 117/201 |
| 7,094,708 B2 | * | 8/2006 | Kato et al. | 438/778 |
| 7,179,334 B2 | * | 2/2007 | Sakamoto et al. | 118/668 |
| 7,387,968 B2 | * | 6/2008 | Joe | 438/716 |
| 7,473,638 B2 | * | 1/2009 | Yang et al. | 438/627 |
| 7,534,730 B2 | * | 5/2009 | Ozaki et al. | 438/770 |
| 7,629,256 B2 | * | 12/2009 | Hasper | 438/680 |
| 7,732,350 B2 | * | 6/2010 | Hasper et al. | 438/785 |
| 7,871,938 B2 | * | 1/2011 | Ozaki et al. | 438/770 |
| 7,900,580 B2 | * | 3/2011 | Kontani et al. | 118/723 E |
| 7,927,662 B2 | * | 4/2011 | Matsuura | 427/255.31 |
| 7,928,019 B2 | * | 4/2011 | Surthi | 438/770 |
| 8,227,322 B2 | * | 7/2012 | Fareed et al. | 438/478 |
| 8,282,992 B2 | * | 10/2012 | Myo et al. | 427/248.1 |
| 8,343,279 B2 | * | 1/2013 | Myo et al. | 118/724 |
| 2002/0073923 A1 | * | 6/2002 | Saito et al. | 118/715 |
| 2002/0124965 A1 | * | 9/2002 | Shibata et al. | 156/345.52 |
| 2003/0049372 A1 | * | 3/2003 | Cook et al. | 427/248.1 |
| 2004/0115584 A1 | * | 6/2004 | Okabe | 432/200 |
| 2004/0132298 A1 | * | 7/2004 | Shibata et al. | 438/689 |
| 2005/0039680 A1 | * | 2/2005 | Beaman et al. | 118/715 |
| 2005/0045102 A1 | * | 3/2005 | Zheng et al. | 118/722 |
| 2005/0056220 A1 | * | 3/2005 | Aoki et al. | 118/722 |
| 2005/0079699 A1 | * | 4/2005 | Suzuki et al. | 438/608 |
| 2005/0271813 A1 | * | 12/2005 | Kher et al. | 427/248.1 |
| 2005/0282365 A1 | * | 12/2005 | Hasebe et al. | 438/513 |
| 2005/0287775 A1 | * | 12/2005 | Hasebe et al. | 438/503 |
| 2005/0287806 A1 | * | 12/2005 | Matsuura | 438/680 |
| 2006/0032443 A1 | * | 2/2006 | Hasebe et al. | 118/715 |
| 2007/0157882 A1 | * | 7/2007 | Ozaki et al. | 118/715 |
| 2009/0017638 A1 | * | 1/2009 | Yoshino et al. | 438/758 |
| 2009/0042404 A1 | * | 2/2009 | Surthi | 438/770 |
| 2009/0087964 A1 | * | 4/2009 | Maeda et al. | 438/482 |
| 2009/0151632 A1 | * | 6/2009 | Okuda et al. | 118/666 |
| 2010/0218724 A1 | * | 9/2010 | Okada | 118/724 |

FOREIGN PATENT DOCUMENTS

| | | | |
|---|---|---|---|
| JP | 01156484 A | * | 6/1989 |
| JP | A-3-16208 | | 1/1991 |
| JP | A-3-255618 | | 11/1991 |
| JP | 09055372 A | * | 2/1997 |
| JP | A-09-055372 | | 2/1997 |
| JP | 2006093411 A | * | 4/2006 |
| JP | 2007027182 A | * | 2/2007 |
| JP | 2007081186 A | * | 3/2007 |
| JP | A-2007-081186 | | 3/2007 |
| JP | 2011114002 A | * | 6/2011 |

OTHER PUBLICATIONS

Translation of Japanese Office Action issued in Japanese Patent Application No. 2008-312661, on Dec. 21, 2009.

English-Language Translation of Notification of Reason(s) for Refusal for Corresponding Japanese Patent Application No. 2008-290104, dated Aug. 12, 2010.

Korean Office Action for corresponding Korean Patent Application No. 10-2009-0003834, issued on Aug. 17, 2010.

Aug. 17, 2012 Office Action issued in U.S. Appl. No. 12/379,420.

May 29, 2012 Office Action issued in Taiwanese Patent Application No. 098100918 (with partial translation).

* cited by examiner

FIG. 7

| WAFER POSITION | UPPER SECTION | MIDDLE SECTION | LOWER SECTION |
|---|---|---|---|
| FILM THICKNESS DISTRIBUTION | | | |
| MEAN THICKNESS [Å] | 37.6 | 36.7 | 36.5 |
| IN-PLANE UNIFORMITY [%] | ±9.7 | ±8.5 | ±7.3 |
| INTER-WAFER UNIFORMITY [%] | ±1.4 | | |

FIG. 8

| WAFER POSITION | UPPER SECTION | MIDDLE SECTION | LOWER SECTION |
|---|---|---|---|
| FILM THICKNESS DISTRIBUTION | | | |
| MEAN THICKNESS [Å] | 33.7 | 33.6 | 33.6 |
| IN-PLANE UNIFORMITY [%] | ±3.8 | ±3.7 | ±4.1 |
| INTER-WAFER UNIFORMITY [%] | ±0.2 | | |

SUBSTRATE PROCESSING APPARATUS AND METHOD FOR MANUFACTURING SEMICONDUCTOR DEVICE

This is a Division of application Ser. No. 12/320,577 filed Jan. 29, 2009, which claims the benefit of Japanese Patent Application Nos. 2008-020761 filed Jan. 31, 2008; 2008-290104 filed Nov. 12, 2008; and 2008-312661 filed Dec. 8, 2008. The disclosure of the prior applications is hereby incorporated by reference herein in their entirety.

BACKGROUND OF THE INVENTION

1. Field of the Invention

The present invention relates to a substrate processing apparatus having a step of processing a substrate and a method for manufacturing a semiconductor device.

2. Description of the Related Art

Conventionally, as one step of manufacturing processes for a semiconductor device, for example, such as DRAM, a substrate processing step for forming a thin film on a substrate has been carried out. Such substrate processing step has been carried out by a substrate processing apparatus which includes: a processing chamber for storing and processing substrates stacked in multiple stages in horizontal posture; a processing gas supply nozzle for supplying a processing gas to the inside of the processing chamber; and an exhaust line for exhausting the inside of the processing chamber. Next, substrate processing step loads a substrate holder which supports a plurality of substrates to the inside of the processing chamber, and supplying the gas from the processing gas supply nozzle to the inside of the processing chamber while exhausting the inside of the processing chamber by means of the exhaust line, whereby the gas is caused to pass spaces between each of the substrates and thus a thin film is formed on each of the substrates.

However, in the above-described substrate processing step, the gas is difficult to flow to the vicinity of each of the substrates. This causes difference in gas supply amount between to the vicinity of the outer periphery and to the vicinity of the center of each substrate, and accordingly the in-plane uniformity of substrate processing sometimes deteriorates. For example, there are some cases where a thin film formed in the vicinity of the outer periphery of the substrate is thicker compared with a thin film formed in the vicinity of the center of the substrate.

In order to promote supply of the gas to the vicinity of the center of each substrate, a method can be conceived in which ring-shaped straightening vanes are provided, each straightening vane being between the circumferential edge of each substrate supported by the substrate holder and the inner wall of the processing chamber. However, in such a method, there are some cases where a substrate transfer mechanism for transferring the substrates to the substrate holder interferes (gets contact) with the straightening vane. In the case where a large stacking pitch of the substrates is given to avoid such interference, there are some cases where the number of substrates which can be collectively processed is reduced. In addition, the substrate holder which has ring-shaped straightening vanes is easy to break and is expensive because of complexity of the structure thereof.

As described above, in the above-described substrate processing step, the gas is difficult to flow to the vicinity of each substrate. This causes difference in gas supply amount between to the vicinity of the outer periphery and to the vicinity of the center of each substrate, and accordingly, the in-plane uniformity of substrate processing sometimes deteriorates. For example, in the case of an Hf oxide film (HfO film) formed by supplying an amine-based Hf raw material gas and an $O_3$ gas onto a substrate, a Zr oxide film (ZrO film) formed by supplying an amine-based Zr raw material gas and an $O_3$ gas onto a substrate, and the like, there are some cases where a film formed in the vicinity of the outer periphery of the substrate is thinner compared with a film formed in the vicinity of the center of the substrate.

In order to promote supply of the gas to spaces between adjacent substrates, a method can also be conceived in which ring-shaped straightening vanes are provided, each straightening vane being between the circumferential edge of each substrate supported by the substrate holder and the inner wall of the processing chamber. FIG. 4 is a schematic structural view of a substrate holder which has such straightening vanes. By providing ring-shaped straightening vanes such that they surround the circumferential edge of the substrates, a part of the processing gas can be adhered onto each straightening vane, whereby, a film formed in the vicinity of the outer periphery of each substrate can be made thinner. Note that, FIG. 5 is a schematic structural view of a substrate holder which does not have straightening vanes.

However, in such a method, there are some cases where a substrate transfer mechanism for carrying the substrates to the substrate holder interferes (gets contact) with the straightening vanes. In the case where a large stacking pitch of the substrates is given to avoid such interference, there are some cases where the number of substrates which can be collectively processed is reduced, whereby productivity of the substrate processing deteriorates. In addition, the substrate holder provided with ring-shaped straightening vanes is easy to break and is expensive because of complexity of the structure thereof.

Hence, the investors and the like made an intensive study on a method of promoting supply of gases to the vicinity of the center of each substrate without reducing the number of substrates which can be collectively processed. As a result of this, the investors have found the knowledge that supply of the gas to the vicinity of the center of each substrate can be promoted and the supply amounts of the gas to the vicinity of the outer periphery and to the vicinity of the center of each substrate can be made more uniform, by supplying an inactive gas from both sides of a processing gas at the same time when supplying the processing gas to the inside of the processing chamber. The present invention has been made on the basis of such knowledge obtained by the investors and the like.

SUMMARY OF THE INVENTION

An object of the present invention is to provide a substrate processing apparatus and a method for manufacturing a semiconductor device which can promote supplying a gas to the vicinity of the center of individual substrates without reducing the number of substrates which can be collectively processed.

An aspect of the present invention is a substrate processing apparatus: including a processing chamber for storing and processing substrates stacked in multiple stages in horizontal posture; a processing gas supply unit for supplying at least one type of processing gas to the inside of the processing chamber; an inactive gas supply unit for supplying an inactive gas to the inside of the processing chamber; and an exhaust unit for exhausting an atmosphere of the inside of the processing chamber. In the substrate processing apparatus, the processing gas supply unit has at least one processing gas supply nozzle which extends running along an inner wall of the processing chamber in the stacking direction of the substrates and which supplies the processing gas to the inside of the processing chamber, and the inactive gas supply unit has a pair of inactive gas supply nozzles which are provided so as to extend running along the inner wall of the processing chamber in the stacking direction of the substrates and to sandwich the processing gas supply nozzle from both sides thereof along the circumferential direction of the substrates, and which supply the inactive gas to the inside of the processing chamber.

Another aspect of the present invention is a substrate processing apparatus: including an outer tube; an inner tube which is installed inside the outer tube with at least the lower end thereof being opened, and which stores the substrates stacked in multiple stages in horizontal posture; a processing gas supply unit for supplying at least one type of processing gas to the inside of the inner tube; an inactive gas supply unit for supplying an inactive gas to the inside of the inner tube; and an exhaust hole provided at a position opposing the processing gas supply nozzle on the side wall of the inner tube. In the substrate processing apparatus, the processing gas supply unit has at least one processing gas supply nozzle which is vertically installed inside the inner tube so as to extend in the stacking direction of the substrates and which has at least one processing gas ejection port for supplying the processing gas, and the inactive gas supply unit has a pair of inactive gas supply nozzles which are provided so as to be vertically installed, inside the inner tube, extending in the stacking direction of the substrates and so as to sandwich the processing gas supply nozzle from both sides thereof along the circumferential direction of the substrates and which have at least one inactive gas ejection port for supplying the inactive gas.

A still another aspect of the present invention is a method for manufacturing a semiconductor device including the steps of: loading substrates stacked in multiple stages in horizontal posture to the inside of the processing chamber;

processing the substrates, by supplying the processing gas, to the inside of the processing chamber, from at least one processing gas supply nozzle which extends running along an inner wall of the processing chamber in the stacking direction of the substrates, and by supplying an inactive gas, to the inside of the processing chamber, from a pair of inactive gas supply nozzles which are provided so as to extend running along the inner wall of the processing chamber in the stacking direction of the substrates and so as to sandwich the processing gas supply nozzle from both sides thereof along the circumferential direction of the substrates; and unloading the processed substrates from the processing chamber.

According to a substrate processing apparatus and a method for manufacturing a semiconductor device of the present invention, it is possible to promote supplying a gas to the vicinity of the center of each substrate without reducing the number of substrates which can be collectively processed.

BRIEF DESCRIPTION OF THE DRAWINGS

FIG. 7 is a table chart showing a result of substrate processing in a comparative example;

FIG. 8 is a table chart showing a result of substrate processing according to an example of the present invention;

DETAILED DESCRIPTION OF THE PREFERRED EMBODIMENTS

The First Embodiment of the Present Invention

Hereinafter, the first embodiment of the present invention will be described with reference to the drawings.

1. The Structure of the Substrate Processing Apparatus

Figure 6:
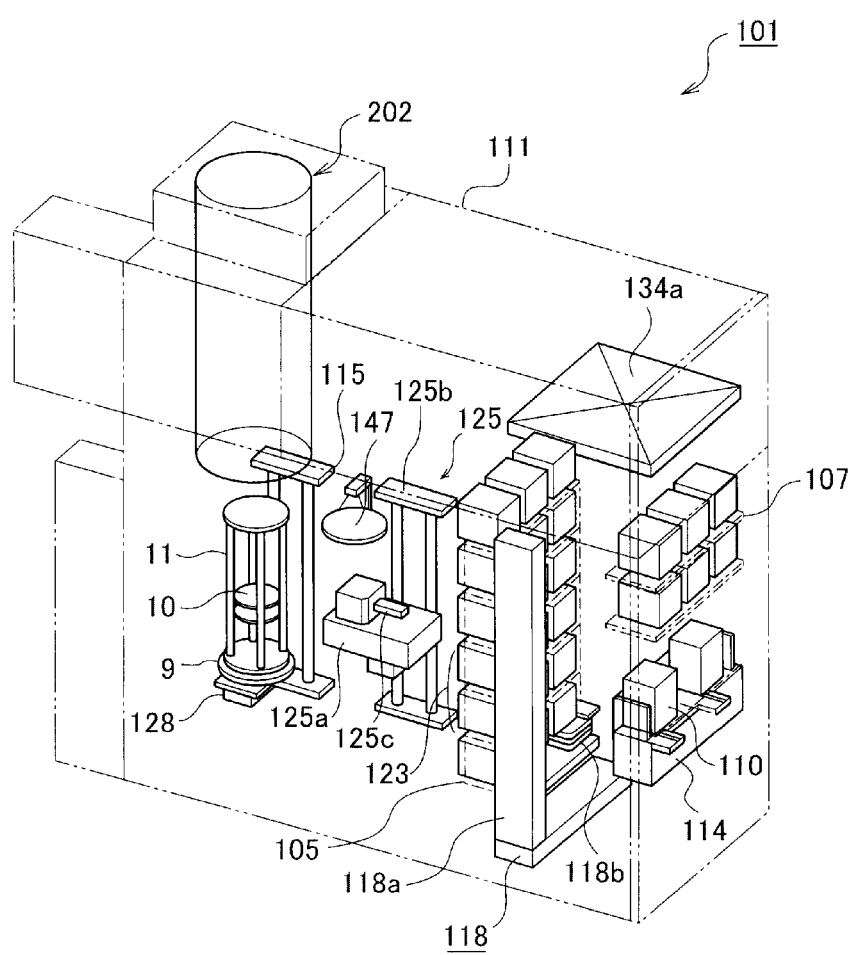
FIG. 6 is a schematic structural view of a substrate processing apparatus according to the first embodiment.

First of all, an example of a structure of a substrate processing apparatus 101 which executes a substrate processing step as one of manufacturing processes for a semiconductor device will be described. FIG. 6 is a perspective view of the substrate processing apparatus 101 according to the present embodiment.

As shown in FIG. 6, the substrate processing apparatus 101 according to the present embodiment includes a housing 111. In order to carry wafers (substrates) 10 made of silicon or the like to and from the housing 111, a cassette 110 which serves as the wafer carrier (substrate storage container) for storing a plurality of the wafers 10 is used. A cassette stage (substrate storage container delivery table) 114 is provided in the front inside of the housing 111. The cassette 110 is placed on the cassette stage 114 by an unillustrated in-process carrier device, and is configured to be unloaded from on the cassette stage 114 to the outside of the housing 111.

The cassette 110 is placed on the cassette stage 114 by the in-process carrier device such that the wafers 10 in the cassette 110 are in vertical postures and a wafer gateway of the cassette 110 faces upward. The cassette stage 114 is configured so as to enable rotating the cassette 110 by 90° in the longitudinal direction to the rear side of the housing 111, causing the wafers 10 in the cassette 110 to be in horizontal posture, and causing the wafer gateway of the cassette 110 to face the rear side of the housing 111.

A cassette shelf (substrate storage container placement shelf) 105 is installed at a substantially central portion in the longitudinal direction inside the housing 111. The cassette shelf 105 is configured to keep a plurality of the cassettes 110 in multiple stages and multiple rows. The cassette shelf 105 has a transfer shelf 123 which stores the cassettes 110 to be carried by a wafer transfer mechanism 125 which will be described later. In addition, above the cassette stage 114, there is provided a spare cassette shelf 107 which is configured to store the cassettes 110 preliminary.

A cassette carrier device (substrate storage container carrier device) 118 is provided between the cassette stage 114 and the cassette shelf 105. The cassette carrier device 118 includes a cassette elevator (substrate storage container elevating mechanism) 118a which can be raised and lowered while holding the cassettes 110, and a cassette carrier mechanism (substrate storage container carrier mechanism) 118b, serving as the carrier mechanism, which can move horizontally while holding the cassettes 110. The cassette carrier device 118 is configured to carry the cassettes 110 alternately to and from the cassette stage 114, the cassette shelf 105, the spare cassette shelf 107, and the transfer shelf 123, by the linkage operation of the cassette elevator 118a and the cassette carrier mechanism 118b.

A wafer transfer mechanism (substrate transfer mechanism) 125 is provided to the rear of the cassette shelf 105. The wafer transfer mechanism 125 includes a wafer transfer device (substrate transfer device) 125a which can rotate or move straightly the wafers 10 in the horizontal direction, and a wafer transfer device elevator (substrate transfer device elevating mechanism) 125b which raises and lowers the wafer transfer device 125a. Note that, the wafer transfer device 125a includes tweezers (substrate transfer fixture) 125c which holds the wafers 10 in horizontal posture. The wafer transfer mechanism 125 is configured to pick up the wafers 10 from the inside of each cassette 110 on the transfer shelf 123 and charge them onto a boat (substrate holder) 11 which will be described later, and to discharge the wafers 10 from the boat 11 and house them in each cassette 110 on the transfer shelf 123, by the linkage operation of the wafer transfer device 125a and the wafer transfer device elevator 125b.

A processing furnace 202 is provided at the top rear section of the housing 111. An opening is provided at the lower end section of the processing furnace 202. Such opening is configured to be opened and closed by a furnace opening shutter (furnace opening and closing mechanism) 147. Note that, the structure of the processing furnace 202 will be described later.

A boat elevator (substrate holder elevating mechanism) 115, serving as the elevating mechanism, which raises and lowers the boat 11 and carries it from and to the processing furnace 202 is provided below the processing furnace 202. An arm 128, serving as the connection device, is provided on the lifting table of the boat elevator 115. A seal cap 9, serving as the cover body, is provided on the arm 128 in horizontal posture. The seal cap 9 supports the boat 11 vertically and closes the lower end of the processing furnace 202 in air tight manner, when the boat 11 is raised by the boat elevator 115.

The boat 11, including a plurality of holding members, is configured to align, in the vertical direction, a plurality of (for example, approx. 50 to 100) the wafers 10 in horizontal posture with the centers thereof being matched with each other, and hold them in multiple stages. The detailed structure of the boat 11 will be described later.

A clean unit 134a including a supply fan and a dust-proof filter is provided above the cassette shelf 105. The clean unit 134a is configured to circulate a clean air, which is a cleaned atmosphere, to the inside of the housing 111.

Meanwhile, a clean unit (not shown), including a supply fan and a dust-proof filter so as to supply a clean air, is installed at the left end of the housing 111, which is the opposite side of the wafer transfer device elevator 125b and the boat elevator 115 sides. It is configured such that the clean air blown out from the unillustrated clean unit is circulated in the wafer transfer device 125a and the boat 11, and subsequently sucked in an unillustrated exhaust device, and is exhausted to the outside of the housing 111.

2. The Operation of the Substrate Processing Apparatus

Next, the operation of the substrate processing apparatus 101 according to the present embodiment will be described.

First of all, the cassette 110 is placed on the cassette stage 114 by unillustrated in-process carrier device such that the wafer 10 is in vertical posture and the wafer gateway of the cassette 110 faces upward. Subsequently, the cassette 110 is rotated by the cassette stage 114 by 90° in the longitudinal direction to the rear side the housing 111. As a result of this, the wafers 10 in the cassette 110 are in horizontal posture, and the wafer gateway of the cassette 110 faces the rear side of the housing 111.

Next, the cassette 110 is automatically carried to, delivered to, and temporarily stored in to a specified shelf position of the cassette shelf 105 or the spare cassette shelf 107 by the cassette carrier device 118, and subsequently transferred from the cassette shelf 105 or the spare cassette shelf 107 to the transfer shelf 123, or the cassette 110 is directly carried to the transfer shelf 123.

When the cassette 110 is transferred to the transfer shelf 123, the wafer 10 is picked up via the wafer gateway from the cassette 110 by the tweezers 125c of the wafer transfer device 125a, and charged into the boat 11 to the rear of a transfer chamber 124 by the linkage operation between the wafer transfer device 125a and the wafer transfer device elevator 125b. The wafer transfer mechanism 125 which have delivered the wafer 10 to the boat 11 returns to the cassette 110, and charges the subsequent wafer 10 into the boat 11.

When a predetermined number of the wafers 10 are charged into the boat 11, the opening at the lower end section of the processing furnace 202 which has been closed by the furnace opening shutter 147 is opened by the furnace opening shutter 147. Subsequently, the seal cap 9 was raised by the boat elevator 115, whereby the boat 11 holding the group of wafers 10 subject to processing is loaded to the inside of the processing furnace 202. After the loading, arbitrary processing is implemented to the wafers 10 in the processing furnace 202. The processing will be described later. After the processing, the wafers 10 and the cassette 110 are released to the outside of the housing 111 in the reverse sequence of the above-described sequence.

3. The Structure of the Processing Furnace

Figure 1:
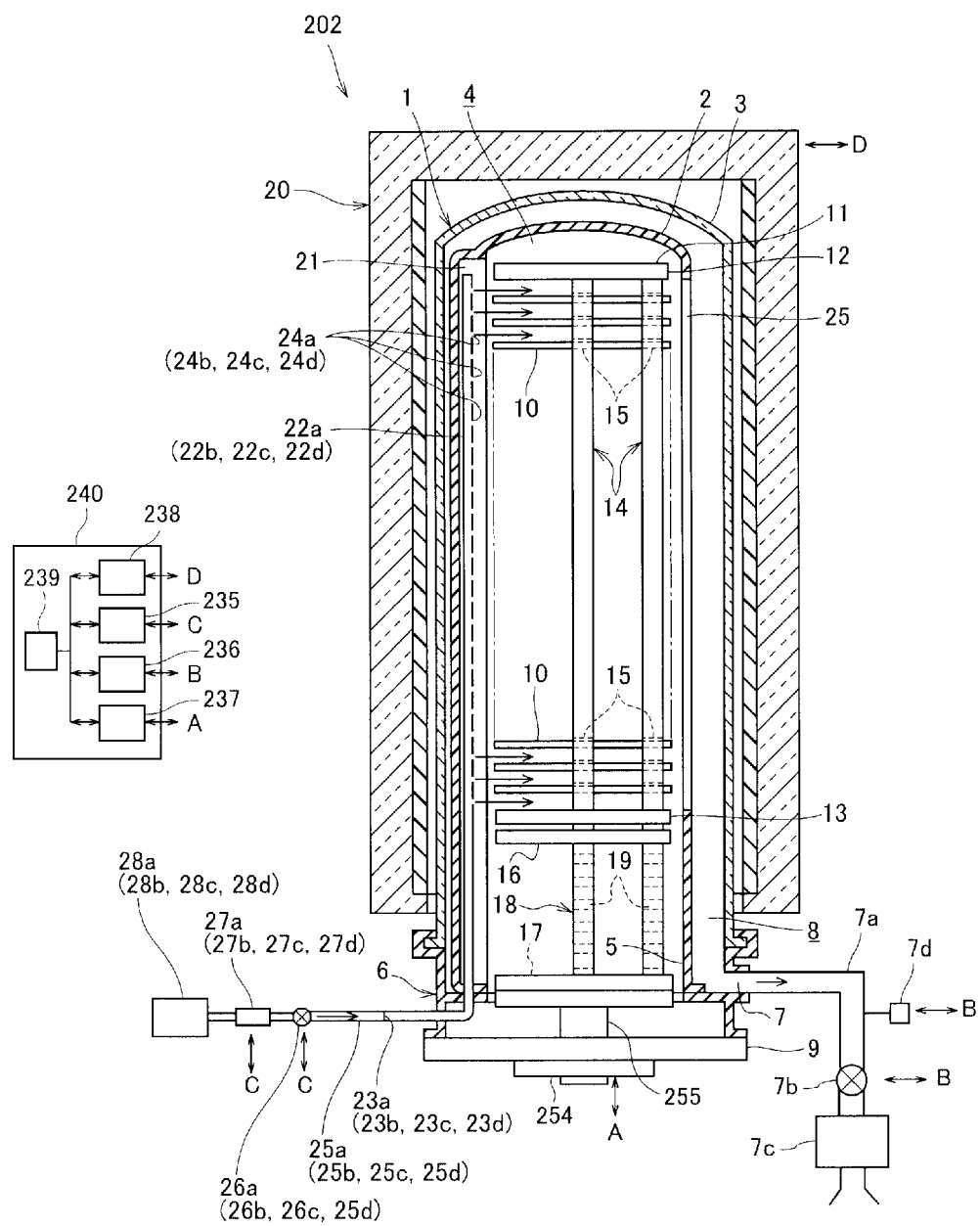
FIG. 1 is a vertical sectional view of a processing furnace of a substrate processing apparatus according to a first embodiment.
Figure 2:
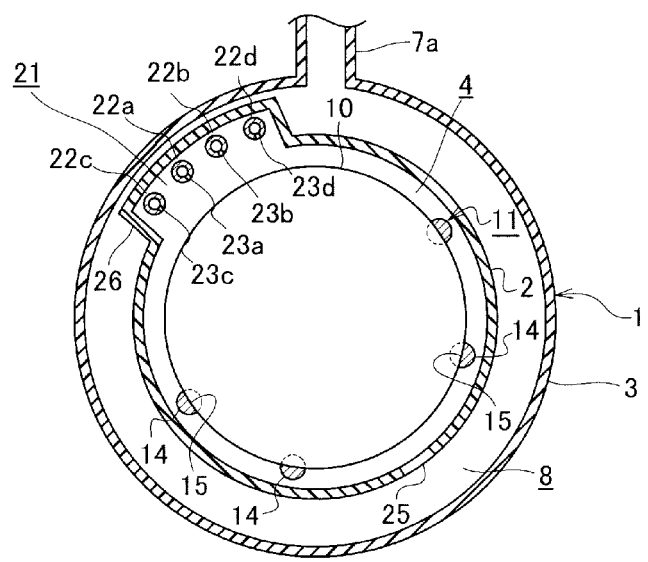
FIG. 2 is a horizontal sectional view of a processing furnace of a substrate processing apparatus according to a first embodiment.
Figure 3:
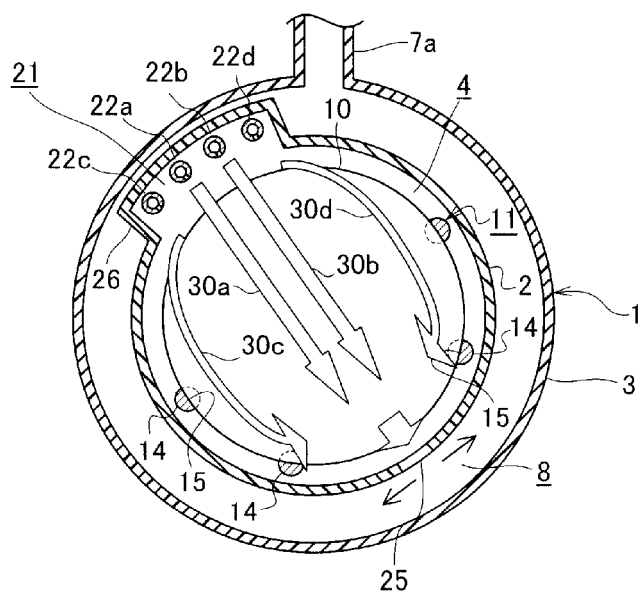
FIG. 3 is a schematic view showing flows of a processing gas and an inactive gas inside the processing furnace.
Figure 4:
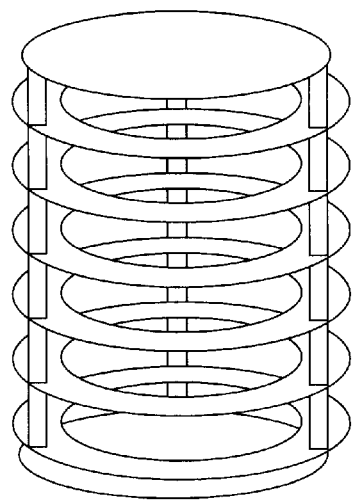
FIG. 4 is a schematic structural view of a substrate holder which has ring-shaped straightening vanes.
Figure 5:
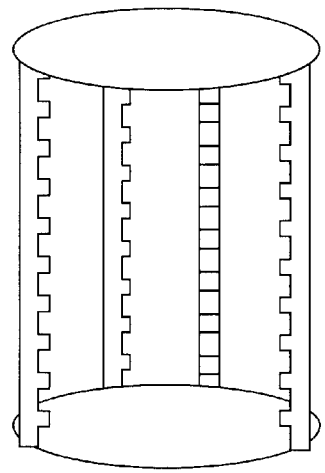
FIG. 5 is a schematic structural view of a substrate holder which does not have straightening vanes.

Subsequently, the structure of the processing furnace 202 of the substrate processing apparatus according to the present embodiment will be described. FIG. 1 is a vertical sectional view of a processing furnace of a substrate processing apparatus according to one embodiment of the present invention. FIG. 2 is a horizontal sectional view of a processing furnace of a substrate processing apparatus according to one embodiment of the present invention, FIG. 3 is a schematic view showing flows of a processing gas and an inactive gas inside the processing furnace. Note that, the processing furnace 202 according to the present embodiment is configured as the CVD device (batch-type vertical-shaped hot wall-type vacuum CVD device) as shown in FIG. 1.

The Process Tube

The processing furnace 202 includes a vertical-shaped process tube 1 which is arranged in the vertical direction such that the center line thereof is vertical and is supported by the housing 111 in a fixed manner. The process tube 1 includes an inner tube 2 and an outer tube 3. The inner tube 2 and the outer tube 3, made of a heat resistant material, such as quartz ($SiO_2$), silicon carbide (SiC), or the like, are integrally formed into cylindrical shapes, respectively.

The inner tube 2 is formed into a cylindrical shape with the upper end being closed and the lower end being opened. In the inner tube 2, a processing chamber 4 is formed, which stores and processes the wafers 10 stacked in multiple stages in horizontal posture by the boat 11 as the substrate holder. The opening at the lower end of the inner tube 2 constitutes a furnace opening 5 through which the boat 11 holding the group of wafers 10 is taken in and out. Therefore, the inner diameter of the inner tube 2 is set so as to be greater than the maximum outer diameter of the boat 11 holding the group of wafers 10. The outer tube 3, which is similar to and slightly greater than the inner tube 2, is formed into a cylindrical shape with the upper end being closed and the lower end being opened, and covers the inner tube 2 concentrically as if the outer tube 3 surrounds the outer side of the inner tube 2. Both lower end sections between the inner tube 2 and the outer tube 3 are sealed by a manifold 6 formed into a circular-ring shape in air tight manner. The manifold 6 is mounted on the inner tube 2 and the outer tube 3 detachably and attachably for the maintenance operation and the cleaning operation for the inner tube 2 and the outer tube 3. The manifold 6 is supported by the housing 111, whereby the process tube 1 is in the state where it is installed vertically.

The Exhaust Unit

An exhaust tube 7a, which serves as the exhaust line for exhausting the atmosphere in the processing chamber 4, is connected to a part of the side wall of the manifold 6. An exhaust port 7 for exhausting the atmosphere in the processing chamber 4 is formed at a connection section of the manifold 6 and the exhaust tube 7a. The inside of the exhaust tube 7a is communicated, via the exhaust port 7, with an inside of an exhaust passage 8 which is constituted by the clearance formed between the inner tube 2 and the outer tube 3. Note that, the horizontal cross-sectional shape of the exhaust passage 8 is a circular-ring shape with a constant width. A pressure sensor 7d, an APC (Auto Pressure Controller) valve 7b serving as the pressure regulating valve, a vacuum pump 7c serving as the vacuum exhaust device, are provided in the exhaust tube 7a in this order from the upstream thereof. The vacuum pump 7c is configured to be capable of evacuation such that the pressure in the processing chamber 4 becomes a certain pressure (degree of vacuum). A pressure control section 236 is electrically connected to the APC valve 7b and the pressure sensor 7d. The pressure control section 236 is configured to control the opening of the APC valve 7b on the basis of the pressure detected by the pressure sensor 7d such that the pressure in the processing chamber 4 becomes a desired pressure at a desired timing. An exhaust unit according to the present embodiment is constituted mainly by the exhaust tube 7a, the exhaust port 7, the exhaust passage 8, the pressure sensor 7d, the APC valve 7b, and the vacuum pump 7c.

The Substrate Holder

The manifold 6 is configured such that the seal cap 9, which closes the lower end opening of the manifold 6 abuts against the manifold 6 from the bottom in the vertical direction. The seal cap 9 is formed into a disk shape having an outer diameter which is equal to or greater than the outer diameter of the outer tube 3. The seal cap 9 is configured to be raised and lowered in the vertical direction in horizontal posture by the boat elevator 115 which is vertically installed outside of the process tube 1.

The boat 11, which serves as the substrate holder for holding the wafers 10, stands vertically on the seal cap 9 by being supported thereby. The boat 11 includes a pair of upper and lower end plates 12, 13, and a plurality of holding members 14 provided vertically between the end plates 12, 13. The end plates 12, 13 and the holding members 14 are made of a heat resistant material, for example, quartz ($SiO_2$), silicon carbide (SiC), or the like. At each holding member 14, a plurality of holding groove 15 are provided at equal intervals in the longitudinal direction. In each holding member 14, the holding grooves 15 are provided so as to oppose with each other. The circumferential edge of each wafer 10 is inserted into the holding grooves 15 in the same stage of the plurality of holding members 14, whereby the boat 11 is configured such that the plurality of wafers 10 are stacked and held in multiple stages in horizontal posture with the centers thereof being matched with each other.

In addition, a pair of upper and lower auxiliary end plates 16, 17 are provided by being supported by a plurality of auxiliary holding members 18 between the boat 11 and the seal cap 9. At each auxiliary holding member 18, a plurality of holding grooves 19 are provided. Each holding groove 19 is configured such that a plurality of disk-shaped insulating plates 216, made of a heat resistant material, for example, quartz ($SiO_2$), silicon carbide (SiC), or the like, are charged in multiple stages in horizontal posture. The insulating plates 216 is configured to make it difficult to transmit heat of a heater unit 20, which will be described later, to the manifold 6 side.

A rotating mechanism 254 for rotating the boat is provided on the seal cap 9 at the opposite side of the processing chamber 4. A rotation axis 255 of the rotating mechanism 254 passes through the seal cap 9 and supports the boat 11 from the bottom. The rotating mechanism 254 is configured to be capable of rotating the wafers 10 in the processing chamber 4 by rotating the rotation axis 255. The seal cap 9 is configured to be raised and lowered in the vertical direction by the above-described boat elevator 115, whereby the boat 11 can be carried to and from the processing chamber 4.

A drive control section 237 is electrically connected to the rotating mechanism 254 and the boat elevator 115. The drive control section 237 is configured to control the rotating mechanism 254 and the boat elevator 115 such that they perform a desired operation at a desired timing.

The Heater Unit

At the outside of the outer tube 3, the heater unit 20 is provided such that it surrounds the outer tube 3. The heater unit, as the heating mechanism for heating the inside of the process tube 1, heats the entire process tube 1 uniformly over or heats it so as to have a certain temperature distribution. The heater unit 20, in the state where it is vertically installed by being supported by the housing 111 of the substrate processing apparatus 101, is configured as the resistance heater, for example, a carbon heater, or the like.

A temperature sensor, which is not shown, serving as the temperature detector, is installed inside the process tube 1. A temperature control section 238 is electrically connected to the heater unit 20 and the temperature sensor. The temperature control section 238 is configured to control the conductivity status to the heater unit 20 on the basis of the temperature information detected by the temperature sensor, such that the temperature in the processing chamber 4 has a desired temperature distribution at a desired timing.

A heating unit according to the present embodiment is configured mainly by the heater unit 20, and the unillustrated temperature sensor.

The Processing Gas Supply Unit and the Inactive Gas Supply Unit

A channel-shaped preliminary chamber 21 is formed such that it extends long in the vertical direction projecting from the side wall of the inner tube 2 outward in the radial direction of the inner tube 2 on the side wall of the inner tube 2 (at the position on the opposite side of, i.e., at the position turned 180 degrees with respect to, an exhaust hole 25 which will be described later). A side wall 26 of the preliminary chamber 21 constitutes a part of the side wall of the inner tube 2. In addition, the preliminary chamber 21 is configured such that the inner wall of the preliminary chamber 21 forms a part of the inner wall of the processing chamber 4. Inside the preliminary chamber 21, there are provided processing gas supply nozzles 22a, 22b which extend in the stacking direction of the wafers 10 running along the inner wall of the preliminary chamber 21 (that is, the inner wall of the processing chamber 4), and supply a processing gas to the inside of the processing chamber 4. In addition, inside the preliminary chamber 21, there are provided a pair of inactive gas supply nozzles 22c, 22d, which are provided so as to extend in the stacking direction of the wafers 10 running along the inner wall of the preliminary chamber 21 (that is, the inner wall of the processing chamber 4) and to sandwich the processing gas supply nozzles 22a, 22b from both sides thereof along the circumferential direction of the wafers 10, and which supply an inactive gas to the inside of the processing chamber 4.

Processing gas introduction port sections 23a, 23b which are the end sections at the upstream side of the processing gas supply nozzles 22a, 22b, and inactive gas introduction port sections 23c, 23d which are the end sections at the upstream side of the inactive gas supply nozzles 22c, 22d, respectively, pass through the side wall of the manifold 6 outward in the radial direction of the manifold 6 and project to the outside of the process tube 1.

Processing gas supply tubes 25a, 25b, which serve as the processing gas supply lines, are connected to the processing gas introduction port sections 23a, 23b, respectively.

In the processing gas supply tube 25a, a processing gas supply source 28a, an MFC (mass flow controller) 27a which serves as a flow quantity control device, and an on-off valve 26a are provided in this sequence from the upstream side. The processing gas supply source 28a supplies a processing gas such as a gas (TEMAH gas or TEMAZ gas) obtained by gasifying, for example, TEMAH (Hf[NCH$_3$C$_2$H$_5$]$_4$, tetrakis ethyl methyl amino hafnium), TEMAZ[NCH$_3$C$_2$H$_5$]$_4$, tetrakis ethyl methyl amino zirconium) as the liquid raw materials. As described above, as the processing gas to be sandwiched from both sides thereof by the inactive gas, a gas of which a thermal decomposition temperature is lower than a processing temperature (deposition temperature), for example, a gas obtained by gasifying TEMAH or TEMAZ (TEMAH gas or TEMAZ gas), or the like is used. Note that, a carrier gas supply tube which is not shown is connected to the processing gas supply tube 25a downstream of the on-off valve 26a. The processing gas supply tube 25a is configured so as to enable diluting the processing gas by supplying an N$_2$ gas as the carrier gas from the carrier gas supply tube, thereby promoting supply of the processing gas to the inside of the processing chamber 4 and diffusion of the processing gas inside the processing chamber 4.

Meanwhile, in the processing gas supply tube 25b, a processing gas supply source 28b which supplies a processing gas, for example, an O$_3$ (ozone) gas, or the like, an MFC (mass flow controller) 27b as a flow quantity control device, and an on-off valve 26b are provided in this sequence from the upstream side. Note that, a carrier gas supply tube which is not shown is connected to the processing gas supply tube 25b downstream of the on-off valve 26b. The processing gas supply tube 25b is configured so as to enable diluting the processing gas by supplying an N$_2$ gas as the carrier gas from the carrier gas supply tube, thereby promoting supply of the processing gas to the inside of the processing chamber 4 and diffusion of the processing gas inside the processing chamber 4.

Inactive gas supply tubes 25c, 25d, as the inactive gas supply lines, are connected to the inactive gas introduction port sections 23c, 23d, respectively. In the inactive gas supply tubes 25c, 25d, there are provided inactive gas supply sources 28c, 28d which supply an inactive gas, for example, an N$_2$ gas, an Ar gas, an He gas, or the like, MFCs (mass flow controllers) 27c, 27d as flow quantity control devices, and on-off valves 26c, 26d, respectively, in this sequence from the upstream side.

A processing gas supply unit according to the present embodiment is constituted mainly by the processing gas supply nozzles 22a, 22b, the processing gas supply tubes 25a, 25b, the processing gas supply sources 28a, 28b, the MFCs 27a, 27b, the on-off valves 26a, 26b, and the unillustrated two carrier gas supply tubes. In addition, an inactive gas supply unit according to the present embodiment is constituted mainly the inactive gas supply nozzles 22c, 22d, the inactive gas supply tubes 25c, 25d, the inactive gas supply sources 28c, 28d, the MFCs 27c, 27d, and the on-off valves 26c, 26d.

A gas supply and flow quantity control section 235 is electrically connected to the MFCs 27a, 27b, 27c, 27d and the on-off valves 26a, 26b, 26c, 26d. The gas supply and flow quantity control section 235 is configured to control the MFCs 27a, 27b, 27c, 27d and the on-off valves 26a, 26b, 26c, 26d, such that the type of the gas, to be supplied to the inside of the processing chamber 4 at each of steps which will be described later, is a desired gas type at a desired timing, the flow quantity of the gas to be supplied is a desired quantity at a desired timing, and the concentration of the processing gas with respect to the inactive gas is a desired concentration at a desired timing.

A plurality of ejection ports 24a, 24b are provided so as to be aligned in the vertical direction at cylindrical sections of the processing gas supply nozzles 22a, 22b inside the processing chamber 4. A plurality of ejection ports 24c, 24d are provided so as to be aligned in the vertical direction at cylindrical sections of the inactive gas supply nozzles 22c, 22d inside the processing chamber 4.

The processing gas supply nozzles 22a, 22b and the inactive gas supply nozzles 22c, 22d are provided inside the preliminary chamber 21, whereby the ejection ports 24a, 24b of the processing gas supply nozzles 22a, 22b and the ejection ports 24c, 24d of the inactive gas supply nozzles 22c, 22d are in the state where the ejection ports 24a, 24b, 24c, 24d are located outward in the radial direction of the inner tube 2 with respect to an inner peripheral surface of the inner tube 2.

The ejection ports 24a, 24b, 24c, 24d are configured such that the number thereof matches, for example, the number of the wafers 10 held by the boat 11. The height positions of the ejection ports 24a, 24b, 24c, 24d are set to positions, where, for example, each ejection port faces a space between the adjacent upper and lower wafers 10 held by the boat 11. Note that, the apertures of the ejection ports 24a, 24b, 24c, 24d may be set to different sizes such that the gas supply amounts to each of the wafers 10 are made uniform. Note that, the ejection ports 24a, 24b, 24c, 24d may be provided such that one ejection port corresponds to a plurality of the wafers 10 (for example, one ejection port corresponds to the several wafers 10).

At the position opposing the processing gas supply nozzles 22a, 22b, that is, at the position on the opposite side, i.e., at the position turned by 180 degrees with respect to the preliminary chamber 21 on the side wall of the inner tube 2, the exhaust hole 25, for example, a slit-shaped through hole, is formed in an elongated shape in the vertical direction. The inside of the processing chamber 4 and the inside of the exhaust passage 8 are communicated with each other via the exhaust hole 25. Accordingly, the exhaust hole 25 is configured such that the processing gas supplied from the ejection ports 24a, 24b of the processing gas supply nozzles 22a, 22b to the inside of the processing chamber 4, and the processing gas supplied from the ejection ports 24a, 24b of the inactive gas supply nozzles 22c, 22d to the inside of the processing chamber 4, flow to the inside of the exhaust passage 8 via the exhaust hole 25, thereafter flow to the inside of the exhaust tube 7a via the exhaust port 7, and are released to the outside of the processing furnace 202. Note that, the exhaust hole 25 is not limited to a slit-shaped through hole, and instead it may be configured as a plurality of holes.

Note that, as shown in FIG. 2, a straight line connecting the processing gas supply nozzle 22a and the exhaust hole 25 and a first straight line connecting the processing gas supply nozzle 22b and the exhaust hole 25 are respectively configured to pass the vicinity of the center of each wafer 10. Note that, the orientations of the ejection ports 24a, 24b are set substantially parallel to the first straight line. In addition, a second straight line connecting the inactive gas supply nozzles 22c and the exhaust hole 25 and a third straight line connecting the inactive gas supply nozzles 22c and the exhaust hole 25 are configured to sandwich the straight line connecting the processing gas supply nozzle 22a and the exhaust hole 25 and the first straight line connecting the processing gas supply nozzles 22b and the exhaust hole 25 from both sides thereof. Note that, the orientations of the ejection ports 24c, 24d may be set such that they are angled outward with respect to the straight line or such that they are substantially parallel to the straight lines. In other words, the ejection port 24c may be configured such that it is opened in the outward orientation with respect to the second straight line or such that it is opened substantially parallel to the second straight line. In addition, the orientation of the ejection port 24d may be configured such that it is opened in the outward orientation with respect to the third straight line or such that it is opened substantially parallel to the third straight line.

Accordingly, when both the processing gas and the inactive gas are to be simultaneously supplied to the inside of the processing chamber 4 as shown in FIG. 3, gas flows 30a, 30b of the processing gas supplied from the ejection ports 24a, 24b of the processing gas supply nozzles 22a, 22b, respectively, to the inside of the processing chamber 4 is sandwiched from both sides thereof by of gas flows 30c, 30d of the inactive gas supplied from the ejection ports 24c, 24d of the inactive gas supply nozzles 22c, 22d, respectively, to the inside of the processing chamber 4, whereby flow passages thereof are restricted. For example, when the inactive gas is supplied to the clearance between the circumferential edge of each wafer 10 and the processing chamber 4, the pressure in the area becomes relatively higher, and thus the processing gas is suppressed from flowing to the clearance between the circumferential edge of each wafer 10 and the processing chamber 4. As a result of this, supply of the processing gas to the vicinity of the center of each wafer 10 is promoted, and the supply amounts of the processing gas to the vicinity of the outer periphery and to the vicinity of the center of each wafer 10 are made more uniform. In addition, the processing gas is diluted by the inactive gas in the clearance between the circumferential edge of each wafer 10 and the processing chamber 4, whereby formation of too thick a film in the vicinity of the outer periphery of each wafer 10 is suppressed.

The Controller

The gas supply and flow quantity control section 235, the pressure control section 236, the drive control section 237, and the temperature control section 238 constitutes also an operating section and the input-output section, and are electrically connected to a main control section 239 which controls the entire substrate processing apparatus. The gas supply and flow quantity control section 235, the pressure control section 236, the drive control section 237, the temperature control section 238, and the main control section 239 as described above are configured as the controller 240.

4. The Substrate Processing Step

One of manufacturing processes for a semiconductor device (device) carried out by the above-described substrate processing apparatus 101 will now be described. As described above, as the processing gas to be sandwiched from both sides thereof by the inactive gas, a gas of which a thermal decomposition temperature is lower than a processing temperature (deposition temperature), for example, a gas obtained by gasifying TEMAH or TEMAZ (TEMAH gas or TEMAZ gas), or the like, may be used. Hereinafter, description will be given on the case where an $HfO_2$ film is fondled with use of the TEMAH gas and the $O_3$ gas as the processing gas in accordance with the ALD method. In the following description, the operation of the individual sections constituting the substrate processing apparatus 101 is controlled by the controller 240.

The ALD (Atomic Layer Deposition) method which is one of the CVD (Chemical Vapor Deposition) methods is a technique for, supplying alternately one by one at least two types of processing gases which react with each other and which are used for film formation, onto the substrate, under certain deposition conditions (temperature, time period, or the like), adsorbing them onto the substrate in the unit of 1 atom, and performing film formation with use of the surface reaction. At this time, the film thickness is controlled on the basis of the number of cycles in which a reactive gas is supplied. (For example, when the deposition rate is assumed to be 1 Å/cycle, film formation is performed in 20 cycles for forming a film of 20 Å.) For example, in the case where an $HFO_2$ film is formed in accordance with the ALD method, a high-quality film can be formed at a low temperature of 180 to 250° C. with use of a TEMAH (Hf $[NCH_3C_2H_5]_4$, tetrakis ethyl methyl amino hafnium) gas and an $O_3$ (ozone) gas.

First of all, as described above, the boat 11 is charged with the group of wafers 10 to be processed, and loaded to the inside of the processing chamber 4. After the boat 11 is loaded to the inside of the processing chamber 4, when the pressure in the processing chamber 4 becomes within the range of 10 to 1000 Pa, for example, becomes 50 Pa and the temperature inside the processing chamber 4 becomes within the range of 180 to 250° C., for example, becomes 220° C., and a cycle, consisting of four steps (Steps 1 to 4) as shown below, is repeated for a certain number of times. Note that, while the following Steps 1 to 4 are executed, the flow quantity of the gases supplied to the surface of each wafer 10 can be made more uniform by rotating the rotating mechanism 254.

Step 1

Both the on-off valve 26a in the processing gas supply tube 25a and the APC valve 7b in the exhaust tube 7a are opened, and then the TEMAH gas as the processing gas is supplied from the ejection port 24a of the processing gas supply nozzle 22a to the inside of the processing chamber 4, while the inside of the processing chamber 4 is exhausted by the vacuum pump 7c. The TEMAH gas is supplied, after being diluted by a carrier gas ($N_2$ gas) supplied from the carrier gas supply tube which is not shown.

Note that, the TEMAH gas is a gas which greatly affects the in-plane uniformity of substrate processing (in-plane uniformity of thickness of the $HfO_2$ film formed on the surface of each wafer 10). Accordingly, in Step 1 according to the present embodiment, at the same time when the TEMAH gas is supplied to the inside of the processing chamber 4, the on-off valves 26c, 26d in the inactive gas supply tubes 25c, 25d are opened, respectively, and whereby the $N_2$ gas as the inactive gas is supplied from both the ejection ports 24c, 24d of the inactive gas supply nozzles 22e, 22d to the inside of the processing chamber 4, respectively. As a result of this, the TEMAH gas supplied from the ejection port 24a of the processing gas supply nozzle 22a to the inside of the processing chamber 4 is sandwiched from both sides thereof, by the $N_2$ gas supplied from both the ejection ports 24c, 24c of the inactive gas supply nozzles 22c, 22d, respectively, to the inside of the processing chamber 4, whereby the flow passage of the TEMAH gas is restricted. For example, when the inactive gas is supplied to the clearance between the circumferential edge of each wafer 10 and the processing chamber 4, the pressure in the area becomes relatively higher, and thus the TEMAH gas is suppressed from flowing (being released) to the clearance between the circumferential edge of each wafer 10 and the processing chamber 4. As a result of this, supply of the TEMAH gas to the vicinity of the center of each wafer 10 is promoted, and the supply amounts of the TEMAH gas to the vicinity of the outer periphery and to the vicinity of the center of each wafer 10 are made more uniform. In addition, the TEMAH gas is diluted by the $N_2$ gas in the clearance between the circumferential edge of each wafer 10 and the processing chamber 4, whereby formation of too thick a film in the vicinity of the outer periphery of each wafer 10 is suppressed. As described above, in Step 1, the inactive gas ($N_2$ gas) supplied from the inactive gas supply tubes 25c, 25d functions as the assist gas which restricts the flow passage of the processing gas, and make the supply amount of the processing gas to the wafers 10 more uniform.

Note that, when the TEMAH gas is supplied from the processing gas supply nozzle 22a, it is preferable that the $N_2$ gas be supplied from the inactive gas supply nozzles 22c, 22d in the flow quantity which is equal to or greater than the flow quantity of the TEMAH gas supplied from the processing gas supply nozzle 22a. In other words, it is preferable that both the flow quantity of the $N_2$ gas supplied from the ejection port 24c of the inactive gas supply nozzle 22c and the flow quantity of the $N_2$ gas supplied from the ejection port 24d of the inactive gas supply nozzle 22d be equal to or greater than the flow quantity of the TEMAH gas supplied from the ejection port 24a of the processing gas supply nozzle 22a. The flow quantity of the TEMAH gas and the flow quantities of the $N_2$ gas are controlled by the MFCs 27a, 27c, 27d, respectively. As a result of this, supply of the TEMAH gas to the vicinity of the center of each wafer 10 is further promoted. In addition, dilution of the TEMAH gas by the $N_2$ gas in the clearance between the circumferential edge of each wafer 10 and the processing chamber 4 is further promoted.

During execution of Step 1, the pressure in the processing chamber 4 is adjusted so as to be within the range of 20 to 900 Pa, for example, to be 50 Pa. In addition, the supply flow quantity of the TEMAH gas from the processing gas supply nozzle 22a is adjusted so as to be within the range of 0.01 to 0.35 times/min, for example, to be 0.3 g/min. The supply flow quantity of the $N_2$ gas (carrier gas) from the carrier gas supply tube (not shown) connected to the processing gas supply tube 25a is adjusted so as to be within the range of 0.1 5o 0.5 g/slm, for example, to be 10 slm. The supply flow quantities of the $N_2$ gas (assist gas) from the inactive gas supply nozzles 22c, 22d are respectively adjusted so as to be within the range of 20 to 30 slm, for example, to be 30 slm. The temperature in the processing chamber 4 is adjusted so as to be within the range of 180 to 250° C., for example, to be 220° C. In addition, the time period during which the wafers 10 are exposed to the TEMAH gas (execution time of Step 1) is set to be within the range of 30 to 180 seconds, for example, to be 120 seconds.

Supplying of the TEMAH gas to the inside of the processing chamber 4 causes the surface reaction (chemical adsorption) of gas molecules of the TEMAH gas with the surface section such as a primer film on the wafer 10.

Step 2

The on-off valve 26a in the processing gas supply tube 25a is closed so as to stop supply of the TEMAH gas to the inside of the processing chamber 4. At this time, with the APC valve 7b in the exhaust tube 7a kept open, the inside of the processing chamber 4 is exhausted by the vacuum pump 7c such that the pressure therein becomes, for example, 20 Pa or less, whereby the remaining TEMAH gas is purged from the inside of the processing chamber 4. In addition, if the on-off valves 26e, 26d in the inactive gas supply tubes 25c, 25d are opened, respectively, and whereby the $N_2$ gas is supplied to the inside of the processing chamber 4, the effect of purging the remaining TEMAH gas from inside of the processing chamber 4 will be further enhanced. In Step 2, the $N_2$ gas supplied from the inactive gas supply tubes 25c, 25d functions as the purge gas which promotes release of the remaining gas in the processing chamber 4.

During execution of Step 2, the pressure in the processing chamber 4 is adjusted to be, for example, 20 Pa or less. In addition, the supply flow quantities of the $N_2$ gas (purge gas) from the inactive gas supply nozzles 22c, 22d, are respectively adjusted so as to be within the range of 0.5 to 20 slm, for example, to be 12 slm. The temperature in the processing chamber 4 is adjusted so as to be within the range of 180 to 250° C., for example, to be 220° C. In addition, the execution time of Step 2 is set to be within the range of 30 to 150 seconds, for example, to be 60 seconds.

Step 3

With the APC valve 7b in the exhaust tube 7a being kept open, the on-off valve 26b in the processing gas supply tube 25b is opened, and whereby an $O_3$ gas as the processing gas is supplied from the ejection port 24b of the processing gas supply nozzle 22b to the inside of the processing chamber 4, while the inside of the processing chamber 4 is exhausted by the vacuum pump 7c. The $O_3$ gas is supplied, after being diluted by the carrier gas ($N_2$ gas) supplied from the carrier gas supply tube which is not shown.

Note that, the $O_3$ gas is a gas which does not greatly affect the in-plane uniformity of substrate processing (in-plane uniformity of thickness of the $HfO_2$ film formed on the surface of each wafer 10). Accordingly, in Step 3 according to the present embodiment, the $N_2$ gas (assist gas) should not be supplied from the inactive gas supply nozzles 22c, 22d. However, in the case where the processing gas supplied in Step 3 is a gas which affects the in-plane uniformity of substrate processing, it is preferable that the $N_2$ gas (assist gas) be supplied from the inactive gas supply nozzles 22c, 22d, also in Step 3 like Step 1. In addition, even in the case where the $O_3$ gas is supplied, the $N_2$ gas (assist gas) may be supplied from the inactive gas supply nozzles 22c, 22d.

During execution of Step 3, the pressure in the processing chamber 4 is adjusted so as to be within the range of 20 to 900 Pa, for example, to be 50 Pa. In addition, the supply flow quantity of the $O_3$ gas from the processing gas supply nozzle 22b is adjusted so as to be within the range of 6 to 20 slm, for example, to be 17 slm. The supply flow quantity of the $N_2$ gas (carrier gas) from the carrier gas supply tube (not shown) connected to the processing gas supply tube 25b is adjusted so as to be within the range of 0 to 2 slm, for example, to be 0.5 slm. The temperature in the processing chamber 4 is adjusted so as to be within the range of 180 to 250° C., for example, to be 220° C. In addition, the time period during which the wafers 10 are exposed to the TEMAH gas (execution time of Step 3) is set to be within the range of 10 to 300 seconds, for example, to be 120 seconds.

Supply of the $O_3$ gas to the inside of the processing chamber 4 causes the surface reaction of the TEMAH gas which has been chemically adsorbed on the surface of each wafer 10 with the $O_3$ gas, whereby an $HfO_2$ film is formed on the wafer 10.

Step 4

The on-off valve 26b in the processing gas supply tube 25b is closed so as to stop supply of the $O_3$ gas to the inside of the processing chamber 4. At this time, with the APC valve 7b in the exhaust tube 7a kept open, the inside of the processing chamber 4 is exhausted by the vacuum pump 7c such that the pressure therein becomes, for example, 20 Pa or less, whereby the remaining $O_3$ gas is purged from the inside of the processing chamber 4. In addition, if the on-off valves 26c, 26d in the inactive gas supply tubes 25c, 25d are opened, respectively, and whereby the $N_2$ gas is supplied to the inside of the processing chamber 4, the effect of purging the remaining $O_3$ gas inside of the processing chamber 4 will be further enhanced. In Step 4, the $N_2$ gas supplied from the inactive gas supply tubes 25c, 25d functions as the purge gas which promotes release of the remaining gas in the processing chamber 4.

During execution of Step 4, the pressure in the processing chamber 4 is adjusted so as to be, for example, 20 Pa or less. In addition, the supply flow quantities of the $N_2$ gas (purge gas) from the inactive gas supply nozzles 22c, 22d, are respectively adjusted so as to be within the range of 0.5 to 20 slm, for example, to be 12 slm. The temperature in the processing chamber 4 is adjusted so as to be within the range of 180 to 250° C., for example, to be 220° C. In addition, the execution time of Step 2 is set to be within the range of 30 to 150 seconds, for example, to be 60 seconds.

Next, with the above-described Steps 1 to 4 being set as one cycle, the cycle is repeated multiple times, whereby an $HfO_2$ film with a certain film thickness is deposited on each wafer 10. Subsequently, the boat 11 holding the processed group of wafers 10 is unloaded from the inside of the processing chamber 4, whereby the substrate processing step according to the present embodiment is terminated.

5. Advantageous Effects of the Present Embodiment

The present embodiment exerts one or a plurality of advantageous effects as described below.

According to the present embodiment, in the above-described Step 1, the TEMAH gas supplied from the ejection port 24a of the processing gas supply nozzle 22a to the inside of the processing chamber 4 is sandwiched from both sides thereof by the $N_2$ gas supplied from the ejection ports 24c, 24d of the inactive gas supply nozzles 22c, 22d, respectively, to the inside of the processing chamber 4, whereby the flow passage of the TEMAH gas is restricted. For example, when the $N_2$ gas is supplied to the clearance between the circumferential edge of each wafer 10 and the processing chamber 4, the pressure in the area becomes relatively higher in the area, and thus the TEMAH gas is suppressed from flowing to the clearance between the circumferential edge of each wafer 10 and the processing chamber 4. As a result of this, supply of the TEMAH gas to the vicinity of the center of each wafer 10 is promoted, whereby the supply amounts of the TEMAH gas to the vicinity of the outer periphery and to the vicinity of the center of each wafer 10 are made more uniform. In addition, the TEMAH gas is diluted by the $N_2$ gas in the clearance between the circumferential edge of each wafer 10 and the processing chamber 4, whereby formation of too thick a film in the vicinity of the outer periphery of each wafer 10 is suppressed.

Note that, in the present embodiment, when the TEMAH gas is supplied from the processing gas supply nozzle 22a, if the $N_2$ gas is supplied from the inactive gas supply nozzles 22c, 22d in the flow quantity which is equal to or greater than the flow quantity of the TEMAH gas supplied from the processing gas supply nozzle 22a, supply of the TEMAH gas to the vicinity of the center of each wafer 10 will be further promoted. In addition, dilution of the TEMAH gas by the $N_2$ gas in the clearance between the circumferential edge of each wafer 10 and the processing chamber 4 is further promoted, whereby formation of too thick an $HfO_2$ film in the vicinity of the outer periphery of each wafer 10 is suppressed.

In addition, according to the present embodiment, the $O_3$ gas is a gas which does not greatly affect the in-plane uniformity of thickness of the $HfO_2$ film formed on the surface of the each wafer 10. Therefore, in Step 3, the $N_2$ gas (assist gas) should not be supplied from the inactive gas supply nozzles 22c, 22d. However, the $N_2$ gas (assist gas) may be supplied from the inactive gas supply nozzles 22c, 22d also in Step 3, like Step 1.

In such a case, the $O_3$ gas supplied from the ejection port 24b of the processing gas supply nozzle 22b to the inside of the processing chamber 4 is sandwiched from both sides thereof by the $N_2$ gas supplied from the ejection ports 24c, 24d of the inactive gas supply nozzles 22c, 22d to the inside of the processing chamber 4, whereby the flow passage of the $O_3$ gas is restricted. For example, when the $N_2$ gas is supplied to the clearance between the circumferential edge of each wafer 10 and the processing chamber 4, the pressure in the area becomes relatively higher, whereby the $O_3$ gas is suppressed from flowing in the clearance between the circumferential edge of each wafer 10 and the processing chamber 4. As a result of this, supply of the $O_3$ gas to the vicinity of the center of each wafer 10 is promoted, whereby the supply amounts of the $O_3$ gas to the vicinity of the outer periphery and to the vicinity of the center of each wafer 10 are made more uniform. In addition, the $O_3$ gas is diluted by the $N_2$ gas in the clearance between the circumferential edge of each wafer 10 and the processing chamber 4, whereby formation of too thick a film in the vicinity of the outer periphery of each wafer 10 is suppressed.

Note that, in the present embodiment, when the $O_3$ gas is supplied from the processing gas supply nozzles 22a, if the $N_2$ gas is supplied from the inactive gas supply nozzles 22c, 22d in the flow quantity which is equal to or greater than the flow quantity of the $O_3$ gas supplied from the processing gas supply nozzles 22b, the $O_3$ gas supplied to the vicinity of the center of each wafer 10 will be further promoted. In addition, dilution of the $O_3$ gas by the $N_2$ gas is further promoted in the clearance between the circumferential edge of each wafer 10 and the processing chamber 4, whereby formation of too thick an $HfO_2$ film in the vicinity of the outer periphery of each wafer 10 is suppressed.

In addition, in Steps 2, 4 of the present embodiment, if the on-off valves 26c, 26d in the inactive gas supply tubes 25c, 25d are opened, respectively, and whereby the $N_2$ gas is supplied to the inside of the processing chamber 4, the effect of purging the remaining TEMAH gas and $O_3$ gas from the inside of the processing chamber 4 will be further enhanced. As a result of this, the time period required for execution of Steps 2, 4 can be reduced, and productivity of the substrate processing can be enhanced.

In addition, according to the present embodiment, there is no need for providing ring-shaped straightening vanes respectively between the circumferential edge of each wafer 10 supported by the boat 11 and the inner wall of the processing chamber 4. Accordingly, there is no need for securing a wide stacking pitch of the wafers 10, decrease in the number of substrates which can be collectively processed can be suppressed. As a result of this, productivity of the substrate processing can be enhanced.

In addition, according to the present embodiment, there is no need for providing ring-shaped straightening vanes, respectively, between the circumferential edges of the wafers 10 supported by the boat 11 and the inner wall of the processing chamber 4. Accordingly, the production cost of the boat 11 and the substrate processing cost can be reduced.

The Second Embodiment of the Present Invention

In the above-described embodiment, the at least one processing gas supply nozzles 22a, 22b supplying the processing gas to the inside of the processing chamber 4 and the pair of the inactive gas supply nozzles 22c, 22d which are provided so as to sandwich the processing gas supply nozzles 22a, 22b from both sides thereof and which supply the inactive gas to the inside of the processing chamber 4, are provided individually. In addition, the processing gas (for example, TEMAH gas) supplied from the processing gas supply nozzle 22a and the processing gas (for example, $O_3$ gas) supplied from the processing gas supply nozzle 22b are respectively sandwiched, from both sides thereof, by the inactive gas from the inactive gas supply nozzles 22c, 22d.

However, the present invention is not limited to this embodiment. Specifically, in the case where only the in-plane uniformity of supply amount of either one type of the processing gas among a plurality of types of the processing gases supplied from at least one processing gas supply nozzle affects the in-plane uniformity of substrate processing (i.e., in the case where the in-plane uniformity of supply amount of other processing gas does not greatly affect the in-plane uniformity of substrate processing), only the processing gas which affects the in-plane uniformity of substrate processing should be sandwiched from both sides thereof by the inactive gas, and the processing gas which does not greatly affect the in-plane uniformity of substrate processing need not be sandwiched from both sides thereof by the inactive gas.

In this case, when the processing gas is supplied from the other processing gas supply nozzle (i.e., the processing gas supply nozzle which supplies the processing gas affecting the in-plane uniformity of substrate processing), at least one processing gas supply nozzle (the processing gas supply nozzle which supplies the processing gas which does not greatly affect the in-plane uniformity of substrate processing) of the at least one processing gas supply nozzle may be configured to supply the inactive gas in the flow quantity which is equal to or greater than the flow quantity of the processing gas supplied from the other processing gas supply nozzle.

For example, in the case where the in-plane uniformity of supply amount of the TEMAH gas greatly affects the in-plane uniformity of substrate processing while the in-plane uniformity of supply amount of the $O_3$ gas does not greatly affect the in-plane uniformity of substrate processing, only the TEMAH gas should be sandwiched from both sides thereof by the $N_2$ gas and the $O_3$ gas need not be sandwiched from both sides thereof by the $N_2$ gas. In addition, the inactive gas supply nozzles 22c and the processing gas supply nozzles 22b may be configured such that they supply the $N_2$ gas, respectively, in the flow quantity which is equal to or greater than the flow quantity of the TEMAH gas supplied from the processing gas supply nozzles 22a, when the TEMAH gas is supplied from the processing gas supply nozzle 22a. In addition, if the inactive gas supply nozzle 22d is not provided, the structure of the substrate processing apparatus can be simplified and the substrate processing cost can be reduced.

The Third Embodiment of the Present Invention

Hereinafter, the third embodiment of the present invention will be described with reference to FIG. 10. The present embodiment is different from the above-described embodiments in that the inactive gas ejection ports 24c, 24d are opened so as to inject the inactive gas to a space (clearance) between the inner wall of the processing chamber 4 and the outer periphery section of the each wafer 10, rather than to the center direction of each wafer 10. The other structures are the same as those of the above-described embodiments.

A straight line connecting the processing gas supply nozzle 22a and an exhaust port 25 and a straight line connecting the processing gas supply nozzle 22b and the exhaust port 25 are respectively configured to pass the vicinity of the center of each wafer 10. Note that, the orientations of the processing gas ejection ports 24a, 24b are set substantially parallel to these straight lines. In other words, the processing gas ejection ports 24a, 24b are opened so as to supply the processing gas to the center of each wafer 10. In addition, a straight line connecting the inactive gas supply nozzle 22c and the exhaust port 25 and a straight line connecting the inactive gas supply nozzle 22c and the exhaust port 25 are configured to sandwich both the straight line connecting the processing gas supply nozzle 22a and the exhaust port 25 and the straight line connecting the processing gas supply nozzles 22b and the exhaust port 25 from both sides thereof. Note that, the orientations of the inactive gas ejection ports 24c, 24d are set such that they are angled outward with respect to the straight lines. In addition, the inactive gas ejection ports 24c, 24d are opened so as to inject the inactive gas to the space (clearance) between the inner wall of the processing chamber 4 and the outer periphery section of each wafer 10, rather than to the center direction of each wafer 10. Note that, the side wall of the preliminary chamber 21 is configured to be substantially parallel to the orientations of the inactive gas ejection ports 24c, 24d.

Figure 10:
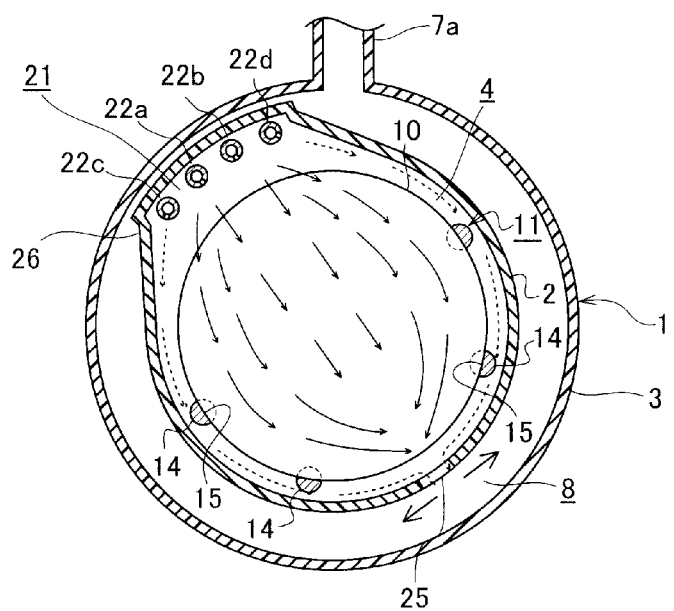
FIG. 10 is a horizontal sectional view of a processing furnace of a substrate processing apparatus according to a third embodiment of the present invention.

Accordingly, as shown in FIG. 10, when the processing gas and the inactive gas are configured to be simultaneously supplied to the inside of the processing chamber 4, the gas flows (arrows shown by solid lines in FIG. 10) of the processing gas supplied from the processing gas ejection ports 24a, 24b of the processing gas supply nozzles 22a, 22b, respectively, to the inside of the processing chamber 4 are sandwiched, from both sides thereof, by the gas flows (arrows shown by solid lines in FIG. 10) of the inactive gas supplied from the inactive gas ejection ports 24c, 24d of the inactive gas supply nozzles 22c, 22d, respectively, to the inside of the processing chamber 4, whereby the flow passages of the processing gas are restricted. For example, when the inactive gas is supplied to the space between the circumferential edge of each wafer 10 and the processing chamber 4, the pressure in the area becomes relatively higher, whereby the processing gas is suppressed from flowing to the clearance between the circumferential edge of each wafer 10 and the processing chamber 4. As a result of this, supply of the processing gas to the vicinity of the center of each wafer 10 is promoted, whereby the supply amounts of the processing gas to the vicinity of the outer periphery and to the vicinity of the center of each wafer 10 are made more uniform. In addition, the processing gas is diluted by the inactive gas in the clearance between the circumferential edge of each wafer 10 and the processing chamber 4, whereby formation of too thick a film in the vicinity of the outer periphery of each wafer 10 is suppressed.

In addition, the inactive gas ejection ports 24c, 24d of the inactive gas supply nozzles 22c, 22d are respectively opened so as to inject the inactive gas to a space between the inner wall of the processing chamber 4 and the outer periphery section of each wafer 10, rather than to the center direction of each wafer 10. Accordingly, the inactive gas supplied from the inactive gas ejection ports 24c, 24d of the inactive gas supply nozzles 22c, 22d, respectively, to the inside of the processing chamber 4 mainly flow to the space between the circumferential edge of each wafer 10 and the processing chamber 4, and hardly flows to the area where the group of wafers 10 are held. As a result of this, dilution by the inactive gas of the processing gas supplied to each wafer 10 is suppressed, and decrease in deposition rate is avoided.

In addition, since inflow of the TEMAH gas and the $O_3$ gas to the clearance between the circumferential edge of each wafer 10 and the processing chamber 4 is suppressed, deposition on the side wall of the processing chamber 4 (the side wall of the inner tube 2), adhesion of raw material components, and generation of foreign matters inside the processing chamber 4 are suppressed. Accordingly, the maintenance cycle of the substrate processing apparatus 101 is extended, whereby productivity of the substrate processing apparatus 101 can be enhanced.

The Fourth Embodiment of the Present Invention

Figure 11:
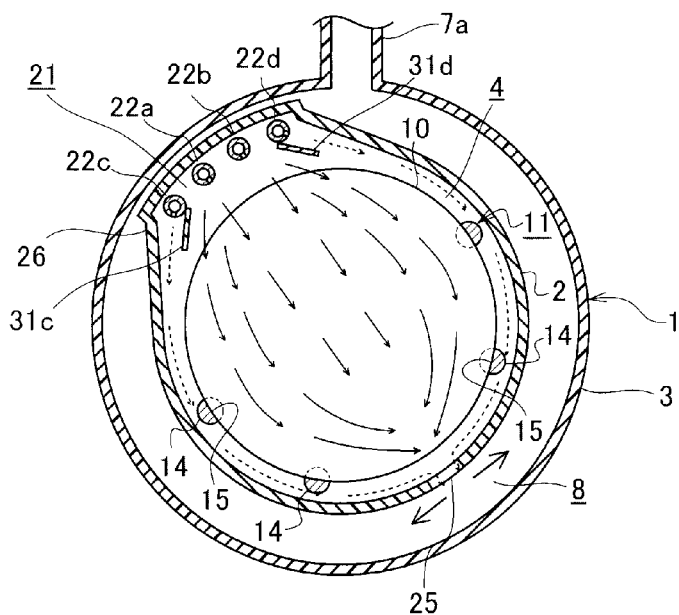
FIG. 11 is a horizontal sectional view of a processing furnace of a substrate processing apparatus according to a fourth embodiment of the present invention.

Hereinafter, the fourth embodiment of the present invention will be described with reference to FIG. 11. The present embodiment is different from the above-described embodiments in that the processing chamber 4 has straightening vanes 31c, 31d therein. The other structures are the same as those of the above-described embodiment.

The straightening vanes 31c, 31d are provided so as to extend in the vertical direction outside of the inactive gas supply nozzles 22c, 22d. The inactive gas supply nozzles 22c, 22d are on the inner side (the wafer 10 side) of the processing chamber 4 with respect to the inactive gas ejection ports 24c, 24d serving as the inactive gas ejection ports. Specifically, the straightening vane 31c is provided so as to extend in the vertical direction between the inactive gas supply nozzle 22c and each wafer 10, and to be substantially parallel to the orientation of the inactive gas ejection port 24c. The straightening vane 31d is provided so as to extend in the vertical direction between the inactive gas supply nozzle 22d and each wafer 10, and to be substantially parallel to the orientation of the inactive gas ejection port 24d. A gas flow passage for guiding a flow of the inactive gas supplied from the inactive gas ejection port 24c is formed between the straightening vane 31c and the side wall of the preliminary chamber 21, and a gas flow passage for guiding a flow of the inactive gas supplied from the inactive gas ejection port 24d is formed between the straightening vane 31d and the side wall of the preliminary chamber 21. The straightening vanes 31c, 31d may be installed to the inactive gas supply nozzles 22c, 22d, respectively, or may be directly installed to the inner wall of the inner tube 2, or the like.

By the configuration as described above, inflow of the inactive gas to the area where the group of wafers 10 are held is further suppressed. As a result of this, dilution by the inactive gas of the processing gas supplied to each wafer 10 is suppressed, whereby decrease in deposition rate is further avoided.

The Fifth Embodiment of the Present Invention

Figure 12:
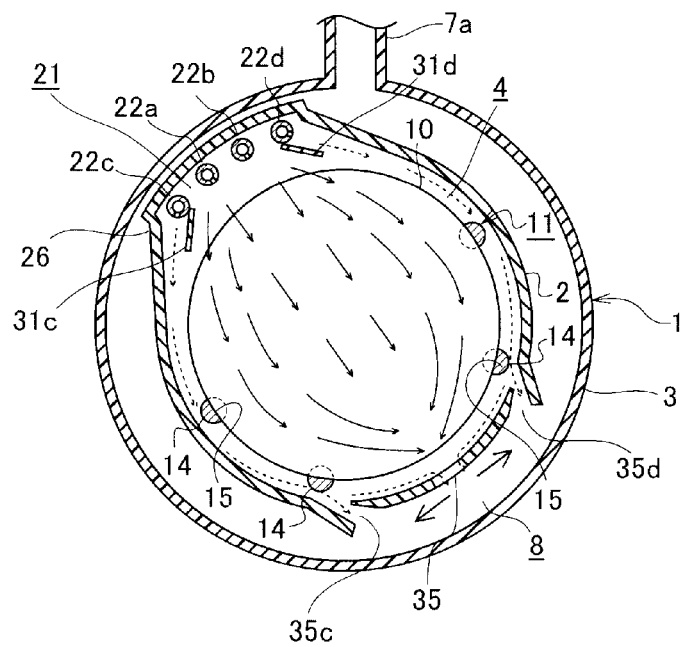
FIG. 12 is a horizontal sectional view of a processing furnace of a substrate processing apparatus according to a fifth embodiment of the present invention.

Hereinafter, the fifth embodiment of the present invention will be described with reference to FIG. 12. The present embodiment is different from the above-described embodiments in that the processing chamber 4 has a processing gas exhaust port 35 for exhausting the processing gas, and inactive gas exhaust ports 35c, 35d for exhausting the inactive gas, respectively, in place of the exhaust port 25. The other structures are the same as those of the above-described embodiments.

The processing gas exhaust port 35 is configured to be similar to the above-described exhaust port 25. Specifically, the processing gas exhaust port 35 is formed in an elongated shape in the vertical direction, as the slit-shaped through hole, at the position on the opposite side of, i.e., at the position turned by 180 degrees with respect to the preliminary chamber 21, that is, at a position on the exhaust port 7 side, on the side wall of the inner tube 2. In addition, the inactive gas exhaust ports 35c, 35d are respectively formed in elongated shapes in the vertical direction, as the slit-shaped through holes, at positions where they sandwich the processing gas exhaust port 35 from both sides thereof.

By the structure as described above, the processing gas supplied from the processing gas ejection ports 24a, 24b is exhausted from the processing gas exhaust port 35, and the inactive gas supplied from the inactive gas ejection ports 24c, 24d is exhausted from the inactive gas exhaust ports 35c, 35d, respectively. As a result of this, the gas flows in the vicinity of the processing gas exhaust port 35, and the inactive gas exhaust ports 35c, 35d, are made smoother, respectively.

Other Embodiments of the Present Invention

The present invention is not limited to the above-described embodiments, and it is obvious that various modifications are possible as long as they are not deviated from the summary of the invention.

Figure 9:
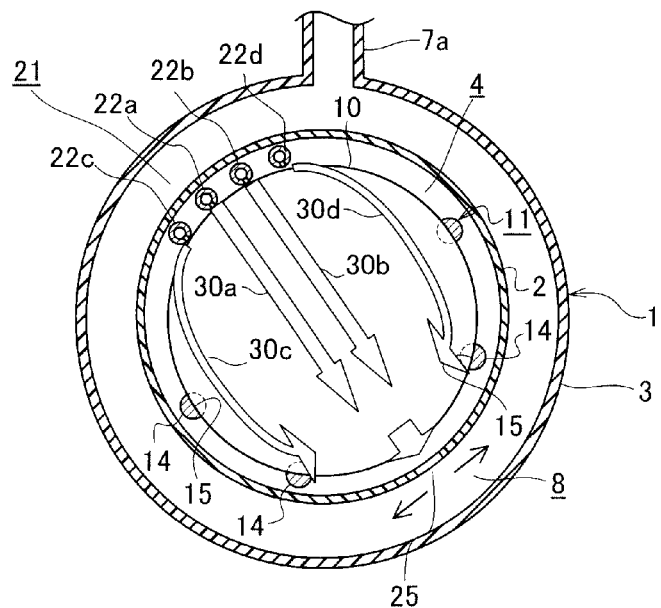
FIG. 9 is a horizontal sectional view of a processing furnace of a substrate processing apparatus according to a second embodiment of the present invention.

For example, the preliminary chamber 21 need not be provided in the inner tube 2. That is, as illustrated in FIG. 9, the processing gas supply nozzles 22a, 22b and the inactive gas supply nozzles 22e, 22d may be located inward in the radial direction of the inner tube 2 with respect to the inner peripheral surface of the inner tube 2.

As described above, the number of the ejection ports 24a, 24b, 24c, 24d need not match the number of the wafers 10. For example, the invention is not limited to the case where the ejection ports 24a, 24b, 24c, 24d are provided at height positions, where each ejection port faces a space between the adjacent upper and lower wafers 10. (The same number as the number of wafers 10 of the ejection ports are provided.) For example, one ejection port may be provided for a plurality of the wafers 10.

In addition, as described above, the exhaust hole 25 formed in the side wall of the inner tube 2 is not limited to a slit-shaped through hole. The exhaust hole 25 may be configured as, for example, a plurality of slot holes, circular holes, polygonal holes, or the like. In the case where the exhaust hole 25 is configured by a plurality of holes, the invention is limited to the case where the number of the holes matches the number of the wafers 10. Instead, the number can be increased or decreased. For example, the invention is not limited to the case where a plurality of holes constituting the exhaust hole 25 are respectively provided at the height positions corresponding to spaces between the stacked wafers 10. (The same number as the number of wafers 10 of the ejection ports are provided.) For example, one hole may be provided for a plurality of the wafers 10. In addition, in the case where the exhaust hole 25 is configured as a series of slot holes (slits), the width thereof may be increased or decreased from the top to the bottom of the inner tube 2. In addition, in the case where the exhaust hole 25 is configured by a plurality of holes, the apertures of these plurality of holes may be increased or decreased from the top to the bottom of the inner tube 2.

In the above-described embodiments, description is given on the case where the processing is performed on the wafers 10. However, the object of processing may be a photomask, print circuit board, substrate, liquid crystal panel, compact disk, and magnetic disk, or the like.

In the above-described embodiments, description is given on deposition of a film in accordance with the ALD method. However, the present invention is not limited to ALD, and is preferably applicable to deposition of a film in accordance with the CVD method. Furthermore, the substrate processing method according to the present invention can be applied to overall substrate processing methods such as an oxide film formation method, diffusion method, or the like.

Hereinafter, an example of the present invention will be described together with a comparative example. FIG. 8 is a table chart showing a result of substrate processing according to an example of the present invention. FIG. 7 s a table chart showing a result of substrate processing according to a comparative example. Note that, in the present example, the substrate processing apparatus and the substrate processing step according to the first embodiment are used.

In the example shown in FIG. 8, a Zr oxide film is formed in accordance with the ALD method, by supplying an amine-based Zr raw material gas, as the processing, gas from the processing gas supply nozzle 22a, and supplying an $O_3$ gas, as the processing gas, from the processing gas supply nozzle 22b. The in-plane uniformity of the film thickness of the Zr oxide film is greatly affected by the in-plane uniformity of gas supply amount of the amine-based Zr raw material. Accordingly, in the present example, the amine-based Zr raw material gas was sandwiched from both sides thereof by an $N_2$ gas (inactive gas). Specifically, when the amine-based Zr raw material gas was supplied from the processing gas supply nozzle 22d in Step 1, the $N_2$ gas was supplied at the flow quantity of 30 slm from each of the inactive gas supply nozzle 22e and the processing gas supply nozzle 22b. (Note that, the acceptable range of the supply flow quantity of the $N_2$ gas (inactive gas) is, for example, 20 to 30 slm.) As a result, as shown in FIG. 7, for the wafers 10 charged to the upper section inside the boat 11, the mean film thickness of the Zr oxide film was 33.7 (Å) and the in-plane uniformly was ±3.9(%). For the wafers 10 charged to the middle section inside the boat 11, the mean film thickness of the Zr oxide film was 33.6 (Å) and the in-plane uniformly was ±3.7(%). For the wafers 10 charged to the lower section in the boat 11, the mean film thickness of the Zr oxide film was 33.6 (Å), and the in-plane uniformly was ±4.1(%). It was confirmed that the in-plane uniformity of substrate processing was remarkably improved compared with the comparative example which will be described later. In addition, the inter-wafer uniformly was ±0.2(%), based on which it was confirmed that inter-substrate uniformity of substrate processing was remarkably improved compared with the comparative example which will be described later.

In the comparative example shown in FIG. 7, the $N_2$ gas was not supplied from the inactive gas supply nozzles 22e, 22d or the processing gas supply nozzle 22b, when the amine-based Zr raw material gas was supplied from the processing gas supply nozzle 22a in Step 1. Other conditions are substantially the same as those in the example shown in FIG. 8. As a result, as shown in FIG. 7, for the wafers 10 charged to the upper section inside the boat 11, the mean film thickness of the Zr oxide film was 37.6 (Å) and the in-plane uniformly was ±9.7(%). For the wafers 10 charged to the middle section of the boat 11, the mean film thickness of the Zr oxide film was 36.7 (Å) and the in-plane uniformity was ±8.5(%). For the wafers 10 charged to the lower section in the boat 11, the mean film thickness of the Zr oxide film was 36.5 (Å), the in-plane uniformly was ±7.3(%), and the inter-wafer uniformly was ±1.4(%).

Preferable Aspects of the Present Invention

Preferable aspects of the present invention will now be supplementary described.

According to the first aspect of the present invention, there is provided a substrate processing apparatus including:

a processing chamber for storing and processing substrates stacked in multiple stages in horizontal posture;

a processing gas supply unit for supplying at least one type of processing gas to the inside of the processing chamber;

an inactive gas supply unit for supplying an inactive gas to the inside of the processing chamber; and an exhaust unit for exhausting an atmosphere of the inside of the processing chamber, wherein the processing gas supply unit has at least one processing gas supply nozzle which extends running along an inner wall of the processing chamber in the stacking direction of the substrates and which supplies the processing gas to the inside of the processing chamber, and the inactive gas supply unit has a pair of inactive gas supply nozzles which are provided so as to extend running along the inner wall of the processing chamber in the stacking direction of the substrates and so as to sandwich the processing gas supply nozzle from both sides thereof along the circumferential direction of the substrates, and which supply the inactive gas to the inside of the processing chamber.

According to the second aspect of the present invention, there is provided a substrate processing apparatus according to the first aspect, wherein the pair of the inactive gas supply nozzles have at least one inactive gas ejection port for supplying the inactive gas toward the center direction of the substrate.

According to the third aspect of the present invention, there is provided a substrate processing apparatus according to the first or second aspect, further including:

a control section for controlling at least the processing gas supply unit and the inactive gas supply unit, wherein the control section controls the processing gas supply unit and the inactive gas supply unit such that a supply flow quantity of the inactive gas is greater than a supply flow quantity of the processing gas.

According to the fourth aspect of the present invention, there is provided a substrate processing apparatus according to the first aspect, further including:

a heating unit for heating an atmosphere in the processing chamber; and a control section for controlling at least the heating unit, wherein the control section controls the heating unit such that a temperature of the atmosphere in the processing chamber becomes a certain processing temperature.

According to the fifth aspect of the present invention, there is provided a substrate processing apparatus according to the fourth aspect, wherein a thermal decomposition temperature of the processing gas is lower than the processing temperature.

According to the sixth aspect of the present invention, there is provided a substrate processing apparatus according to the fourth or fifth aspect, further including:

a control section for controlling at least the processing gas supply unit and the inactive gas supply unit, wherein the control section controls the processing gas supply unit and the inactive gas supply unit such that a supply flow quantity of the inactive gas is greater than a supply flow quantity of the processing gas.

According to the seventh aspect of the present invention, there is provided a substrate processing apparatus including:

an outer tube;

an inner tube which is installed inside the outer tube with at least the lower end thereof being opened, and which stores the substrates stacked in multiple stages in horizontal posture;

a processing gas supply unit for supplying at least one type of processing gas to the inside of the inner tube;

an inactive gas supply unit for supplying an inactive gas to the inside of the inner tube; and an exhaust hole provided at a position opposing the processing gas supply nozzle on the side wall of the inner tube, wherein the processing gas supply unit has at least one processing gas supply nozzle which is vertically installed inside the inner tube so as to extend in the stacking direction of the substrates and which has at least one processing gas ejection port for supplying the processing gas, and the inactive gas supply unit has a pair of inactive gas supply nozzles which are provided so as to be vertically installed, inside the inner tube, extending in the stacking direction of the substrates and so as to sandwich the processing gas supply nozzle from both sides thereof along the circumferential direction of the substrates and which have at least one inactive gas ejection port for supplying the inactive gas.

According to the eighth aspect of the present invention, there is provided a substrate processing apparatus according to the seventh aspect, wherein a preliminary chamber is formed projecting outward in the radial direction in the inner tube, the processing gas supply nozzle is provided in the preliminary chamber, and the processing gas ejection port is located outward in the radial direction with respect to an inner peripheral surface of the inner tube.

According to the ninth aspect of the present invention, there is provided a substrate processing apparatus according to the seventh aspect, wherein a preliminary chamber is formed projecting outward in the radial direction in the inner tube, the pair of the inactive gas supply nozzles are provided in the preliminary chamber, and the inactive gas ejection port is located outward in the radial direction with respect to an inner peripheral surface of the inner tube.

According to the tenth aspect of the present invention, there is provided a substrate processing apparatus according to any one of the seventh to ninth aspects, wherein a first straight line connecting the processing gas supply nozzle and the exhaust hole is configured to pass the vicinity of the center of the substrates.

According to the eleventh aspect of the present invention, there is provided a substrate processing apparatus according to the tenth aspect, wherein the processing gas ejection port is configured to be opened substantially parallel to the first straight line.

According to the twelfth aspect of the present invention, there is provided a substrate processing apparatus according to the tenth aspect, wherein second and third straight lines connecting the pair of the inactive gas supply nozzles and the exhaust hole, respectively, are configured to sandwich the first straight line from both sides thereof, respectively.

According to the thirteenth aspect of the present invention, there is provided a substrate processing apparatus according to the twelfth aspect, wherein the inactive gas ejection port is configured to be opened substantially parallel to the second and third straight lines.

According to the fourteenth aspect of the present invention, there is provided a substrate processing apparatus according to the twelfth aspect, wherein the inactive gas ejection port is configured to be opened in the outward orientation with respect to the second and third straight lines.

According to the fifteenth aspect of the present invention, there is provided a substrate processing apparatus according to any one of the seventh to fourteenth aspects, further including:

a heating unit for heating an atmosphere in the processing chamber;

a control section for controlling at least the processing gas supply unit, wherein the control section controls the heating unit such that a temperature of the atmosphere in the processing chamber becomes a certain processing temperature.

According to the sixteenth aspect of the present invention, there is provided a substrate processing apparatus according to the fifteenth aspect, wherein a thermal decomposition temperature of the processing gas is lower than the processing temperature.

According to the seventeenth aspect of the present invention, there is provided a substrate processing apparatus according to any one of the seventh to fourteenth aspects, further including:

a control section for controlling at least the processing gas supply unit and the inactive gas supply unit, wherein the control section controls the processing gas supply unit and the inactive gas supply unit such that a supply flow quantity of the inactive gas is greater than a supply flow quantity of the processing gas.

According to the eighteenth aspect of the present invention, there is provided a substrate processing apparatus according to the fifteenth or sixteenth aspect, wherein the control section controls the processing gas supply unit and the inactive gas supply unit such that a supply flow quantity of the inactive gas is greater than a supply flow quantity of the processing gas.

According to the nineteenth aspect of the present invention, there is provided a substrate processing apparatus according to the seventh aspect, wherein the pair of the inactive gas supply nozzles has at least one inactive gas ejection port for supplying the inactive gas toward the center direction of the substrate.

According to the twentieth aspect of the present invention, there is provided a substrate processing apparatus which repeatedly supplies two or more types of processing gases alternately to a surface of a substrate for a certain number of times, in a manner so as not to mix the processing gases, and which forms a thin film on the surface of the substrate, the substrate processing apparatus including:

a processing chamber for storing and processing substrates stacked in multiple stages in horizontal posture;

a processing gas supply unit for supplying two or more types of the processing gases to the inside of the processing chamber;

an inactive gas supply unit for supplying an inactive gas to the inside of the processing chamber; and an exhaust unit for exhausting an atmosphere of the inside of the processing chamber, wherein the processing gas supply unit has at least two processing gas supply nozzles which extend running along an inner wall of the processing chamber in the stacking direction of the substrates and supply the processing gas to the inside of the processing chamber, and the inactive gas supply unit has a pair of inactive gas supply nozzles which are provided so as to extend running along the inner wall of the processing chamber in the stacking direction of the substrates and so as to sandwich at least one processing gas supply nozzle of the at least two processing gas supply nozzles from both sides thereof, along the circumferential direction of the substrates, and which supply the inactive gas to the inside of the processing chamber.

According to the twenty-first aspect of the present invention, there is provided a substrate processing apparatus according to the twentieth aspect, wherein the at least one processing gas supply nozzle sandwiched from both sides thereof by the pair of the inactive gas supply nozzles supplies the processing gas which affects the in-plane uniformity of thin film thickness.

According to the twenty-second aspect of the present invention, there is provided a substrate processing apparatus according to the twentieth aspect, wherein the processing gas supply unit has:

a first processing gas supply nozzle for supplying a first processing gas which affects the in-plane uniformity of thin film thickness, and a second processing gas supply nozzle for supplying a second processing gas which does not affect the in-plane uniformity of thin film thickness, and the first processing gas supply nozzle is sandwiched from both sides thereof by the pair of the inactive gas supply nozzles along the circumferential direction of the substrates.

According to the twenty-third aspect of the present invention, there is provided a substrate processing apparatus, including:

a processing chamber for storing and processing substrates stacked in multiple stages in horizontal posture;

at least one processing gas supply nozzle which extends running along an inner wall of the processing chamber in the stacking direction of the substrates and supplies a processing gas to the inside of the processing chamber;

a pair of inactive gas supply nozzles which extend running along the inner wall of the processing chamber in the stacking direction of the substrates and which supply an inactive gas to the inside of the processing chamber; and an exhaust line for exhausting the inside of the processing chamber, wherein the pair of the inactive gas supply nozzles are arranged such that a flow passage of a gas flow of the processing gas supplied from the processing gas supply nozzle is restricted by a gas flow of the inactive gas supplied from the inactive gas supply nozzle.

According to the twenty-fourth aspect of the present invention, there is provided a substrate processing apparatus, including:

a processing chamber for storing and processing substrates stacked in multiple stages in horizontal posture;

at least one processing gas supply nozzle which extends running along an inner wall of the processing chamber in the stacking direction of the substrates and which supplies a processing gas to the inside of the processing chamber;

a pair of the inactive gas supply nozzles which extend running along the inner wall of the processing chamber in the stacking direction of the substrates and which supply the inactive gas to the inside of the processing chamber; and an exhaust line for exhausting the inside of the processing chamber, wherein the pair of the inactive gas supply nozzles supply the inactive gas to a clearance between the inner wall of the processing chamber and the substrate.

According to the twenty-fifth aspect of the present invention, there is provided a method for manufacturing a semiconductor device, including the steps of:

loading substrates stacked in multiple stages in horizontal posture to the inside of the processing chamber;

processing the substrates, by supplying a processing gas, to the inside of the processing chamber, from at least one processing gas supply nozzle which extends running along an inner wall of the processing chamber in the stacking direction of the substrates, and by supplying an inactive gas, to the inside of the processing chamber, from a pair of inactive gas supply nozzles, which are provided so as to extend running along the inner wall of the processing chamber in the stacking direction of the substrates and so as to sandwich the processing gas supply nozzle from both sides thereof along the circumferential direction of the substrates; and unloading the processed substrates from the processing chamber.

According to the twenty-sixth aspect of the present invention, there is provided a method for manufacturing a semiconductor device according to the twenty-fifth aspect, wherein In the step of processing the substrates, a flow quantity of the inactive gas supplied from each of the pair of the inactive gas supply nozzles is set to be equal to or greater than a flow quantity of the processing gas supplied from the processing gas supply nozzle.

According to the twenty-seventh aspect of the present invention, there is provided a method for manufacturing a semiconductor device which repeatedly supplies two or more types of processing gases alternately to a surface of a substrate for a certain number of times, in a manner so as not to mix the processing gases, and which forms a thin film on the surface of the substrate, the method including the steps of loading substrates stacked in multiple stages in horizontal posture to the inside of the processing chamber;

a first gas supply step for supplying a first processing gas to the inside of the processing chamber;

a first exhaust step for exhausting the atmosphere in the processing chamber;

a second gas supply step for supplying a second processing gas to the inside of the processing chamber; and a second exhaust step for exhausting the atmosphere in the processing chamber, wherein in at least one step of the first gas supply step and the second gas supply step, an inactive gas is supplied so as to sandwich at least one of a gas flow of the first processing gas or a gas flow of the second processing gas from both sides thereof.

According to the twenty-eighth aspect of the present invention, there is provided a substrate processing apparatus, including:

a processing chamber for storing and processing substrates stacked in multiple stages in horizontal posture;

at least one processing gas supply nozzle which extends running along an inner wall of the processing chamber in the stacking direction of the substrates and supplies a processing gas to the inside of the processing chamber;

a pair of the inactive gas supply nozzles which are provided so as to extend running along the inner wall of the processing chamber in the stacking direction of the substrates and so as to sandwich the processing gas supply nozzle from both sides thereof along the circumferential direction of the substrates and which supply the inactive gas to the inside of the processing chamber;

an inactive gas ejection port provided in the inactive gas supply nozzle; and an exhaust line for exhausting the inside of the processing chamber, wherein the inactive gas ejection port is opened so as to inject the inactive gas to a space between the inner wall of the processing chamber and the outer periphery section of the substrate.

According to the twenty-ninth aspect of the present invention, there is provided a substrate processing apparatus according to any one of the first to twenty-eighth aspects, further including:

a pair of straightening vanes outside of the inactive gas nozzles, respectively, which are located on the inner side of the processing chamber with respect to the inactive gas ejection port.

According to the thirtieth aspect of the present invention, there is provided a substrate processing apparatus according to the twenty-eighth aspect, further including:

a pair of straightening vanes each of which extends between the inactive gas supply nozzle and the substrate in the vertical direction and located substantially parallel to the orientation of the inactive gas ejection port.

According to the thirty-first aspect of the present invention, there is provided a substrate processing apparatus according to the twenty-ninth or thirtieth aspect, wherein each straightening vane is mounted on the inactive gas supply nozzle.

According to the thirty-second aspect of the present invention, there is provided a substrate processing apparatus according to the twenty-ninth or thirtieth aspect, wherein each straightening vane is mounted on the inner wall of the processing chamber.

What is claimed is:

1. A method for manufacturing a semiconductor device, comprising the steps of:
   loading substrates stacked in multiple stages in horizontal posture to the inside of a processing chamber;
   processing the substrates, loaded into the process chamber; and
   unloading the processed substrates from the processing chamber, the step of processing the substrate comprising:
   a first process step of supplying a first processing gas with a first flow rate to the processing chamber through a first processing gas supply nozzle, and further supplying an inactive gas with a flow rate equal or greater than the first flow rate to the processing chamber through each nozzle of a pair of inactive gas supply nozzles configured to sandwich the first processing gas supply nozzle;
   a second process step of stopping a supply of the first processing gas and supplying the inactive gas through at least the pair of the inactive gas supply nozzles, after the first process step;
   a third process step of supplying a second processing gas to the processing chamber through a second processing gas supply nozzle, and further supplying the inactive gas to the processing chamber through at least the pair of the inactive gas supply nozzles, after the second process step; and
   a fourth process step of stopping a supply of the second processing gas, and supplying the inactive gas through at least the pair of the inactive gas supply nozzles, after the third process step.

2. The method for manufacturing a semiconductor device according to claim 1, wherein in the third process step, the second processing gas is supplied with the second flow rate, and the inactive gas is supplied with a flow rate equal or greater than the second flow rate.

3. The method for manufacturing a semiconductor device according to claim 1, wherein the second processing gas is a gas which does not affect in-plane uniformity of the substrate processing.

4. The method for manufacturing a semiconductor device according to claim 1, wherein in the first process step, the gas is supplied so that the first processing gas is sandwiched by the inactive gas.

5. The method for manufacturing a semiconductor device according to claim 1, wherein in the first process step, the first processing gas and the inactive gas are supplied so that a pressure in an area between an inner wall of the processing chamber and the substrate is set to be higher than a pressure on a circumferential edge of the substrate.

6. The method for manufacturing a semiconductor device according to claim 2, wherein in the third process step, the second processing gas and the inactive gas are supplied so that the second processing gas is sandwiched by the inactive gas.

7. The method for manufacturing a semiconductor device according to claim 2, wherein in the third process step, the third processing gas and the inactive gas are supplied so that a pressure in an area between an inner wall of the processing chamber and the substrate is set to be higher than a pressure on a circumferential edge of the substrate.

8. The method for manufacturing a semiconductor device according to claim 1, wherein
   the first gas supply nozzle, the second gas supply nozzle, and the inactive gas supply nozzle have a plurality of gas ejection ports arranged in a stacking direction of the substrate, respectively;
   the plurality of gas ejection ports are provided to face a space between the two adjacent substrates in the stacking direction of the substrate respectively;
   in the first process step, the first processing gas and the inactive gas are respectively supplied to the processing chamber from the gas ejection ports formed on the first gas supply nozzle and the gas ejection ports formed on at least the pair of the inactive gas nozzles;
   in the second process step, the inactive gas is supplied to the processing chamber from the gas ejection ports formed on at least the pair of the inactive gas nozzles;
   in the third process step, the second processing gas and the inactive gas are respectively supplied to the processing chamber from the gas ejection ports formed on the second gas supply nozzle and the gas ejection ports formed on at least the pair of the inactive gas supply nozzles; and in the fourth process step, the inactive gas is supplied to the processing chamber from the gas ejection ports formed on at least the pair of the inactive gas supply nozzles.

* * * * *